United States Patent
Kim et al.

(10) Patent No.: US 12,062,606 B2
(45) Date of Patent: Aug. 13, 2024

(54) MEMORY DEVICE

(71) Applicant: Samsung Electronics Co., Ltd., Suwon-si (KR)

(72) Inventors: Sujeong Kim, Seoul (KR); Inmo Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 379 days.

(21) Appl. No.: 17/337,212

(22) Filed: Jun. 2, 2021

(65) Prior Publication Data

US 2022/0115320 A1    Apr. 14, 2022

(30) Foreign Application Priority Data

Oct. 14, 2020   (KR) .................... 10-2020-0132575

(51) Int. Cl.
| | | |
|---|---|---|
| *H10B 43/40* | (2023.01) | |
| *H01L 23/522* | (2006.01) | |
| *H10B 41/27* | (2023.01) | |
| *H10B 41/41* | (2023.01) | |
| *H10B 43/27* | (2023.01) | |

(52) U.S. Cl.
CPC ......... *H01L 23/5226* (2013.01); *H10B 41/27* (2023.02); *H10B 41/41* (2023.02); *H10B 43/27* (2023.02); *H10B 43/40* (2023.02)

(58) Field of Classification Search
None
See application file for complete search history.

(56) References Cited

U.S. PATENT DOCUMENTS

| | | | |
|---|---|---|---|
| 7,679,133 B2 | 3/2010 | Son et al. | |
| 8,379,458 B1 * | 2/2013 | Or-Bach | ............ H01L 29/0673 |
| | | | 365/177 |
| 8,553,466 B2 | 10/2013 | Han et al. | |
| 8,559,235 B2 | 10/2013 | Yoon et al. | |
| 8,654,587 B2 | 2/2014 | Yoon et al. | |

(Continued)

FOREIGN PATENT DOCUMENTS

CN          109346473 A      2/2019

OTHER PUBLICATIONS

Office Action dated Dec. 19, 2022 by the German Patent and Trademark Office for corresponding DE 102021123110.8.

*Primary Examiner* — Sarah K Salerno
(74) *Attorney, Agent, or Firm* — Muir Patent Law, PLLC

(57) ABSTRACT

A memory device includes: a memory cell region including gate electrodes spaced apart from each other on a first semiconductor substrate to be stacked, and channel structures; and a peripheral circuit region including upper metal lines disposed above a second semiconductor substrate, disposed below the memory cell region. The first semiconductor substrate includes first regions, having a first value corresponding to a distance between the first semiconductor substrate and the upper metal lines, and second regions having a second value, lower than the first value. A reference voltage for operating the memory device is transmitted to at least one of the first upper metal lines, disposed below the first region. Accordingly, coupling capacitance for a significant signal may be reduced while maintaining a length of a connection portion and the magnitude of resistance of a common source line. Furthermore, an error rate of the memory device may be reduced.

20 Claims, 21 Drawing Sheets

(56) References Cited

U.S. PATENT DOCUMENTS

| | | |
|---|---|---|
| 10,355,009 B1 | 7/2019 | Kai et al. |
| 10,446,566 B2 | 10/2019 | Parekh et al. |
| 10,522,460 B2 | 12/2019 | Ichinose et al. |
| 2011/0233648 A1 | 9/2011 | Seol et al. |
| 2018/0190668 A1 | 7/2018 | Kim et al. |
| 2019/0067308 A1 | 2/2019 | Yun et al. |
| 2019/0296031 A1 | 9/2019 | Murata et al. |

* cited by examiner

MEMORY DEVICE

CROSS-REFERENCE TO RELATED APPLICATION(S)

This application claims benefit of priority under 35 U.S.C. § 119 to Korean Patent Application No. 10-2020-0132575 filed on Oct. 14, 2020 in the Korean Intellectual Property Office, the disclosure of which is incorporated herein by reference in its entirety.

BACKGROUND

The present disclosure relates to a memory device.

Recent memory devices are required to have a high level of integration and high speed so as to process more data within a short period of time. An increase in speed of a memory device may be primarily implemented using a decrease in resistance of a metal line. However, an RC delay caused by a parasitic capacitor may result in a limitation in increasing a speed of a memory device. Accordingly, a method of reducing parasitic capacitance using a decoupling capacitor has been proposed as a method of reducing coupling noise associated with an RC delay. However, a structural issue makes it difficult to form a high-capacity decoupling capacitor. Accordingly, there is demand for a fundamental solution to reduce coupling noise.

SUMMARY

Example embodiments provide a memory device including a memory cell region in which a lower surface of a common source line, facing a lower metal line, is not planar. Coupling capacitance between the common source line and a metal line for transmitting a significant signal may be reduced using the memory device. Furthermore, example embodiments provide a memory device having improved performance.

According to an example embodiment, a memory device includes: a memory cell region including a first semiconductor substrate, gate electrodes spaced apart from each other on the first semiconductor substrate to be stacked in a first direction, perpendicular to an upper surface of the first semiconductor substrate, and channel structures penetrating through the gate electrodes and electrically connected to the first semiconductor substrate; and a peripheral circuit region including a second semiconductor substrate, disposed below the memory cell region, and a plurality of upper metal lines disposed above the second semiconductor substrate at a first height to extend in a second direction, parallel to an upper surface of the second semiconductor substrate. The first semiconductor substrate includes first regions, having a first distance between a lower surface of the first semiconductor substrate and an upper surface of first upper metal lines of the plurality of upper metal lines, and second regions having a second distance between the lower surface of the first semiconductor substrate and an upper surface of second upper metal lines of the plurality of upper metal lines, the second distance is shorter than the first distance. The first upper metal lines are disposed below the first regions, and the second upper metal lines are disposed below the second regions, and at least one of the first upper metal lines is configured to transmit a reference voltage for operating the memory cell region and the peripheral circuit region.

According to an example embodiment, a memory device includes: a memory cell region including a first semiconductor substrate, gate electrodes spaced apart from each other on the first semiconductor substrate to be stacked in a first direction, perpendicular to an upper surface of the first semiconductor substrate, and channel structures penetrating through the gate electrodes and disposed in a recessed portion of the first semiconductor substrate; and a peripheral circuit region including a second semiconductor substrate disposed below the memory cell region, a plurality of lower metal lines disposed above the second semiconductor substrate at a predetermined height to extend in a second direction, parallel to an upper surface of the second semiconductor substrate, and a plurality of upper metal lines disposed between the plurality of lower metal lines and the first semiconductor substrate to extend in a third direction, parallel to an upper surface of the second semiconductor substrate and perpendicular to the second direction. The first semiconductor substrate includes first regions, having a first distance between a lower surface of the first semiconductor substrate and an upper surface of first upper metal lines of the plurality of upper metal lines, and second regions having a second distance between a lower surface of the first semiconductor substrate and an upper surface of second upper metal lines of the plurality of upper metal lines, the second distance being shorter than the first distance. The first upper metal lines and second upper metal lines may be at the same height with respect to a top surface of the second semiconductor substrate. The first regions and the second regions are alternately disposed in the third direction.

According to an example embodiment, a memory device includes: a first semiconductor substrate including first regions, having a first thickness, and second regions having a second thickness greater than the first thickness; a second semiconductor substrate disposed below the first semiconductor substrate to overlap the first semiconductor substrate in a first direction, perpendicular to an upper surface of the first semiconductor substrate; a plurality of metal lines disposed between the first semiconductor substrate and the second semiconductor substrate to extend in a direction, parallel to an upper surface of the second semiconductor substrate, and including first metal lines configured that a bandgap reference signal is transmitted through the first metal lines; gate electrodes spaced apart from each other on the first semiconductor substrate to be stacked in the first direction; insulating layers stacked alternately with the gate electrodes; and channel structures penetrating through the gate electrodes and the insulating layers and disposed in a recessed portion of the first semiconductor substrate. The first metal lines are disposed below the first region.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
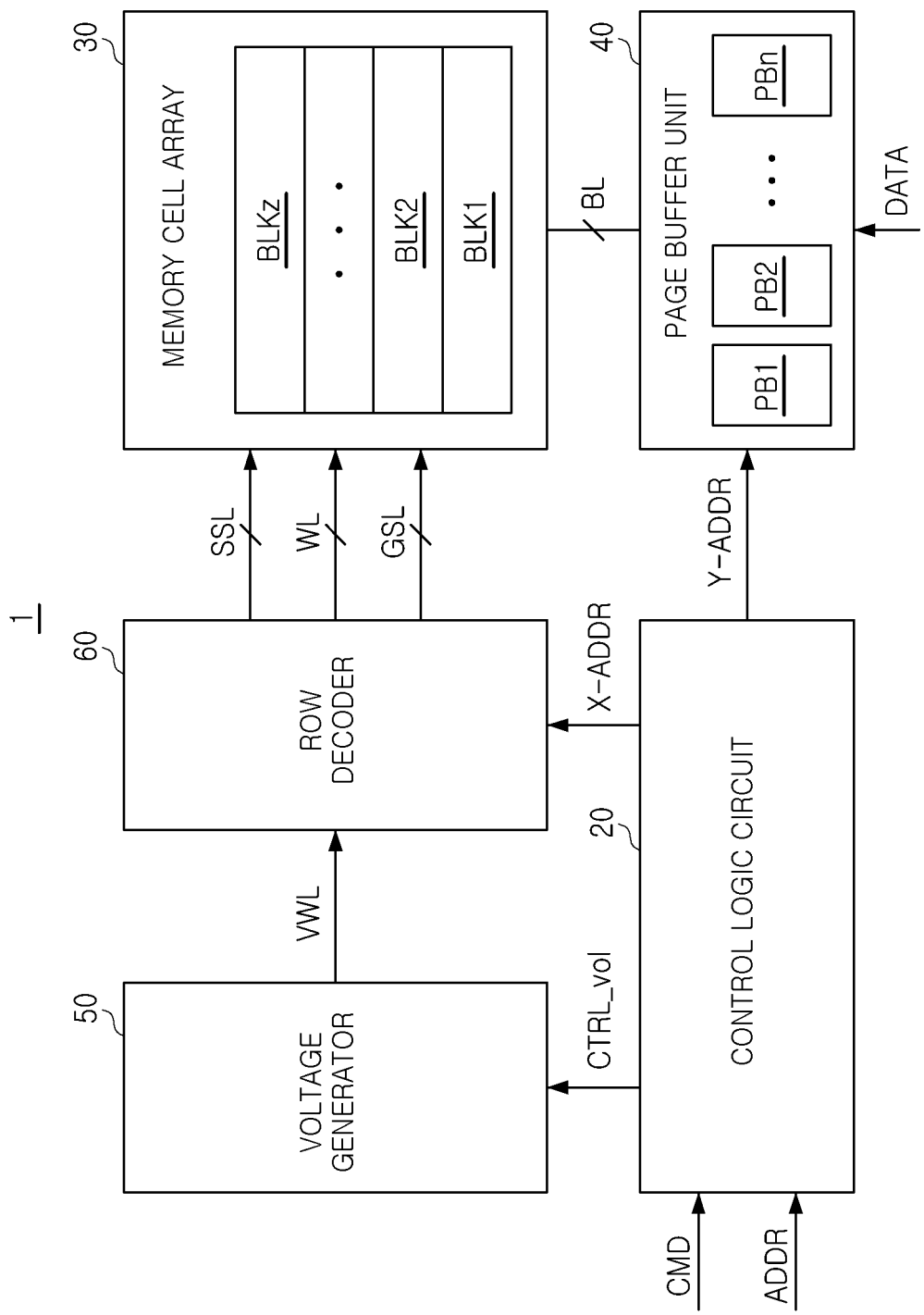
FIG. 1 is a block diagram of a memory device according to an example embodiment.

FIG. 1 is a block diagram of a memory device according to an example embodiment.

Referring to FIG. 1, a memory device 1 may include a control logic circuit 20, a memory cell array 30, a page buffer unit 40, a voltage generator 50, and a row decoder 60. Although not illustrated in FIG. 1, the memory device 1 may further include a memory interface circuit, and may further include a column logic, a pre-decoder, a temperature sensor, a command decoder, an address decoder, and the like.

The control logic circuit 20 may generally control various operations in the memory device 1. The control logic circuit 20 may output various control signals in response to a command CMD and/or an address ADDR from the memory interface circuit. As an example, the control logic circuit 20 may output a voltage control signal CTRL_vol, a row address X-ADDR, and a column address Y-ADDR.

The memory cell array 30 may include a plurality of memory blocks BLK1 to BLKz (where z is a positive integer). Each of the plurality of memory blocks BLK1 to BLKz may include a plurality of memory cells. The memory cell array 30 may be connected to the page buffer unit 40 through bit lines BL, and may be connected to the row decoder 60 through word lines WL, string select lines SSL, and ground select lines GSL.

In an example embodiment, the memory cell array 30 may include a three-dimensional memory cell array, and the three-dimensional memory cell array may include a plurality of memory cell strings. Each of the memory cell strings may include memory cells, respectively connected to word lines vertically stacked on a substrate. U.S. Pat. Nos. 7,679,133, 8,553,466, 8,654,587, 8,559,235, and U.S. Patent Publication No. 2011/0233648 are incorporated herein by reference. In an example embodiment, the memory cell array 30 may include a two-dimensional memory cell array, and the two-dimensional memory cell array may include a plurality of memory cell strings arranged in row and column directions.

Spatially relative terms, such as "beneath," "below," "lower," "above," "upper," "vertical," "horizontal" and the like, may be used herein for ease of description to describe positional relationships. It will be understood that the spatially relative terms encompass different orientations of the device in addition to the orientation depicted in the figures.

The page buffer unit 40 may include a plurality of page buffers PB1 to PBn (where n is an integer of 3 or greater), and the plurality of page buffers PB1 to PBn may be connected to the memory cells through a plurality of bit lines BL, respectively. The page buffer unit 40 may select at least one of the bit lines BL in response to the column address Y-ADDR. The page buffer unit 40 may operate as a write driver or a sense amplifier depending on an operation mode. For example, the page buffer unit 40 may apply a bit line voltage, corresponding to data to be programmed, to a selected bit line during a program operation. The page buffer unit 40 may sense a current or a voltage on the selected bit line to sense data stored in a memory cell during a read operation.

The voltage generator 50 may generate various voltages for performing program, read, and erase operations, based on the voltage control signal CTRL_vol. For example, the voltage generator 50 may generate a program voltage, a read voltage, a program verify voltage, an erase voltage, or the like, as a word line voltage VWL.

The row decoder 60 may select one of the plurality of word lines WL and may select one of the plurality of string select lines SSL, in response to the row address X-ADDR. For example, the row decoder 60 may apply a program voltage and a program verify voltage to a selected word line during a program operation, and may apply a read voltage to a selected word line during a read operation.

Figure 2:
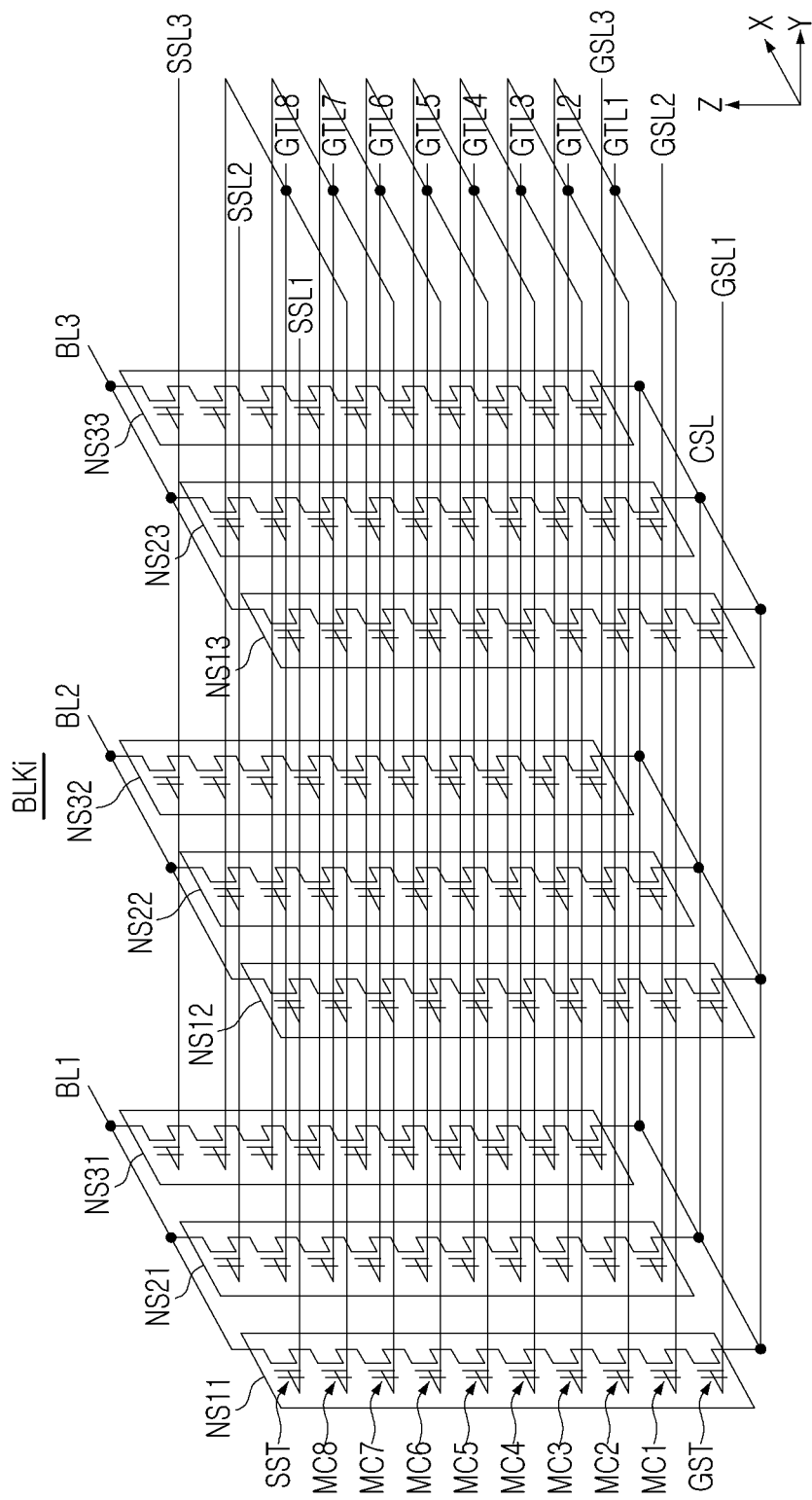
FIG. 2 is a view illustrating a 3D V-NAND structure applicable to a memory device according to an example embodiment.

FIG. 2 is a view illustrating a 3D V-NAND structure applicable to a memory device according to an example embodiment.

When a storage module of a memory device is implemented as a 3D V-NAND flash memory, each of a plurality of memory blocks, constituting the storage module, may be represented by an equivalent circuit, as illustrated in FIG. 2.

A memory block BLKi, illustrated in FIG. 2, indicates a three-dimensional memory block having a three-dimensional structure formed on a substrate. For example, a plurality of memory cell strings, included in the memory block BLKi, may be formed in a direction perpendicular to the substrate.

Referring to FIG. 2, a memory block BLKi may include a plurality of memory cell strings NS11 to NS33 connected between bit lines BL1, BL2, and BL3 and a common source line CSL. Each of the plurality of memory cell strings NS11 to NS33 may include a string select transistor SST, a plurality of memory cells MC1, MC2 . . . , and MC8, and a ground select transistor GST. In FIG. 2, each of the plurality of memory cell strings NS11 to NS33 is illustrated as including eight memory cells MC1, MC2 . . . , and MC8 connected in series, but the present disclosure is not limited thereto.

The string select transistor SST may be connected to corresponding string select lines SSL1, SSL2, and SSL3. The plurality of memory cells MC1, MC2 . . . , and MC8 may be connected to corresponding gate lines GTL1, GTL2 . . . , and GTL8, respectively. The gate lines GTL1, GTL2 . . . , and GTL8 may correspond to word lines, and some of the gate lines GTL1, GTL2 . . . , and GTL8 may correspond to dummy word lines. The ground select transistor GST may be connected to corresponding ground select lines GSL1, GSL2, and GSL3. The string select transistor SST may be connected to corresponding bit lines BL1, BL2, and BL3, and the ground select transistor GST may be connected to the common source line CSL. In the memory device according to an example embodiment, the common source lines CSL may be connected to each other. Accordingly, the common source line CSL may be formed below the memory block BLK in the form of a plate. For example, the common source line CSL may be a conductor pattern/layer and/or a semiconductor pattern/layer extending horizontally, e.g., in X and Y directions indicated in FIGS. 2 and 3. As an example, the common source line CSL may include or be a common source line plate PCSL.

Gate lines (for example, GTL1) having the same height may be commonly connected, and ground select lines GSL1, GSL2, and GSL3 and string select lines SSL1, SSL2, and SSL3 may be separated from each other. In FIG. 2, the memory block BLK is illustrated as being connected to eight gate lines GTL1, GTL2 . . . , and GTL8 and three bit lines BL1, BL2, BL3, but the present disclosure is not limited thereto.

Figure 3:
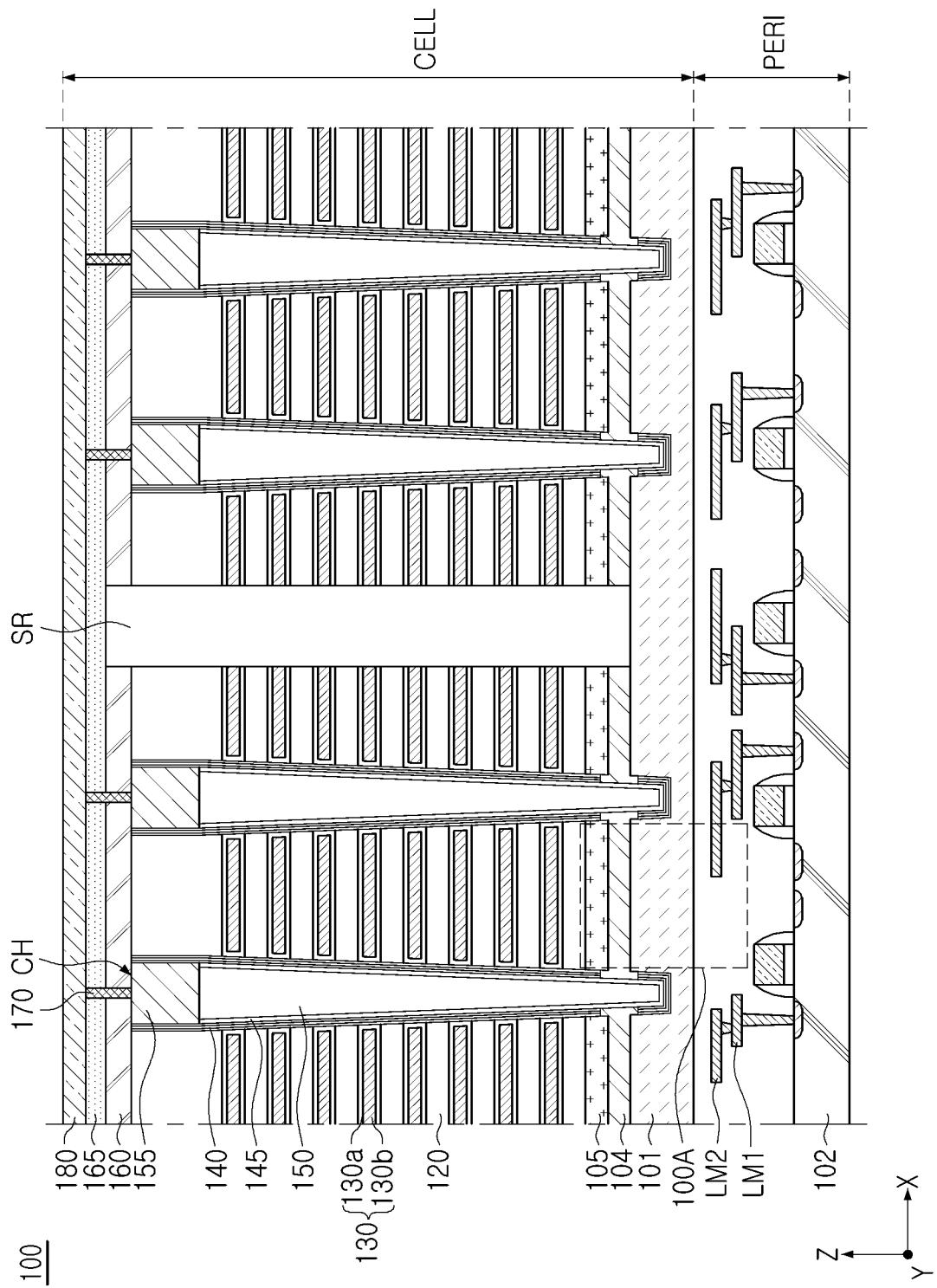
FIG. 3 is a cross-sectional view of a memory device according to an example embodiment.

FIG. 3 is a cross-sectional view of a memory device according to an example embodiment.

Referring to FIG. 3, a memory device 100 may include a memory cell region CELL, in which data is stored, and a peripheral circuit region PERI disposed below the memory cell region CELL.

In the memory device 100 illustrated in FIG. 3, the memory cell region CELL may include a first semiconductor substrate 101, a plurality of insulating layers 120, a plurality of gate electrodes 130, a first conductive layer 104, a second conductive layer 105, channel structures CH, and a separation region SR.

In the memory device 100 according to an example embodiment, the first semiconductor substrate 101 may have an upper surface extending in an X-axis direction and a Y-axis direction. As an example, a direction perpendicular to the upper surface of the first semiconductor substrate 101 (for example, a Z direction) may be defined as a first direction, and directions parallel to the upper surface of the first semiconductor substrate 101 (for example, Y and X directions) may be defined as a second direction and a third direction, respectively. The first semiconductor substrate 101 may include or be formed of a semiconductor material such as a group IV semiconductor, a group III-V compound semiconductor, or a group II-VI oxide semiconductor. For example, the group IV semiconductor may include or be silicon, germanium, or silicon-germanium. However, the configuration of the first semiconductor substrate 101 is not limited thereto, and the first semiconductor substrate 101 may be provided as an epitaxial layer, a silicon-on-insulator (SOI) layer, or a semiconductor-on-insulator (SEOI) layer.

The memory device 100 according to an example embodiment may include insulating layers 120 and gate electrodes 130 spaced apart from each other to be alternately stacked in the first direction (for example, a Z direction), perpendicular to the upper surface of the first semiconductor substrate 101. For example, the insulating layers 120 may be vertically and/or horizontally spaced apart from each other. The gate electrodes 130 may be vertically and/or horizontally spaced apart from each other. The insulating layers 120 and the gate electrodes may be stacked alternately in a vertical direction. The insulating layers 120 may include or be formed of an insulating material such as a silicon oxide or a silicon nitride. For example, among the insulating layers 120, an uppermost insulating layer may have a greater thickness than the other insulating layers 120. The gate electrodes 130 may extend by different lengths in at least one region of the first semiconductor substrate 101.

In the memory device 100 according to an example embodiment, the gate electrodes 130 may include at least one lower gate electrode, at least one upper gate electrode, and an intermediate gate electrode between lower gate electrodes and upper gate electrodes. Referring to the memory block BLKi illustrated in FIG. 2 together with FIG. 3, the lower gate electrode may correspond to the ground select lines GSL1, GSL2, and GSL3, and the upper gate electrode may correspond to the string select lines SSL1, SSL2, and SSL3. For example, the ground select lines GSL1, GSL2, GSL3 may be connected to a gate electrode of the ground select transistor GST, and the string select lines SSL1, SSL2, SSL3 may be connected to a gate electrode of the string select transistor SST.

At least some of the intermediate gate electrodes may correspond to the gate lines GTL1, GTL2 . . . , and GTL8 illustrated in FIG. 2. On the other hand, some of the intermediate gate electrodes may be dummy gate electrodes. For example, the number of intermediate gate electrodes may be determined depending on capacity of the memory device 100 according to an example embodiment.

Each of the gate electrodes 130 may include a first gate layer 130a and a second gate layer 130b. As an example, the first gate layer 130a may include or be formed of tungsten nitride (WN), tantalum nitride (TaN), titanium nitride (TiN), or combinations thereof. For example, the second gate layer 130b may include or be formed of a metallic material such as tungsten (W). However, the configuration of the gate electrodes 130 is not limited thereto, and the gate electrodes 130 may include three or more layers, and may include polycrystalline silicon or a metal silicide material.

The first conductive layer 104 and the second conductive layer 105 may be sequentially stacked on the upper surface of the first semiconductor substrate 101. At least a portion of the first semiconductor substrate 101, the first conductive layer 104, and the second conductive layer 105 may function as a common source line in the memory device 100 according to an example embodiment, and may correspond to the common source line CSL illustrated in FIG. 2. As described above, the first conductive layer 104 and the second conductive layer 105 may be plate-shaped (e.g., horizontally and/or two dimensionally extending) conductive layers, and may be disposed between the insulating layers 120 and/or the gate electrodes 130, and the first semiconductor substrate 101. The first conductive layer 104 and the second conductive layer 105 may include or be formed of a semiconductor material. As an example, the first conductive layer 104 and the second conductive layer 105 may include polycrystalline silicon. For example, at least the first conductive layer 104 may be doped with impurities, and the second conductive layer 105 may be doped with impurities, or may include impurities diffused from the first conductive layer 104. The first semiconductor substrate 101, the first conductive layer 104, and the second conductive layer 105 may collectively constitute a common source line. However, the configuration of the common source line is not limited to that illustrated in FIG. 3, and the memory cell region CELL may further include an insulating layer and/or an additional conductive layer adjacent to the common source line according to an example embodiment.

In the memory device 100 according to an example embodiment, each of the channel structures CH may extend in the first direction and may be disposed to penetrate through the gate electrodes 130 and the insulating layers 120. However, this is only an example and is not limited to that illustrated in FIG. 3, and the channel structures CH may be disposed to penetrate through at least a portion of the first semiconductor substrate 101. For example, the channel structures CH may be disposed at recessed portions of the first semiconductor substrate 101. The channel structures CH may be disposed on the first semiconductor substrate 101 to be spaced apart from each other in a direction, horizontal to the upper surface of the first semiconductor substrate 101, in rows and columns. Each of the channel structures CH may have a side surface perpendicular to the upper surface of the first semiconductor substrate 101, or may be in the form of a column having an inclined side narrowed downwardly in a direction toward/approaching the first semiconductor substrate 101 depending on an aspect ratio.

In the memory device 100 according to an example embodiment, each of the channel structures CH may include a channel layer 145, a channel insulating layer 150, and a pad layer 155. As an example, each of the channel structures CH may further include a gate dielectric layer 140 including a plurality of layers disposed between the channel layer 145 and the gate electrodes 130 to trap electric charges. In the channel structures CH, the channel layer 145 may be formed to have an annular shape surrounding a channel insulating layer 150 disposed therein. However, according to an example embodiment, the channel layer 145 may have a columnar shape such as a cylindrical shape or a prismatic shape without the channel insulating layer 150. A portion of the gate dielectric layer 140 may be removed from a lower end of each of the channel structures CH, and the channel layer 145 may be electrically connected to and/or contact the first conductive layer 104 in the removed region.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

In the memory device 100 according to an example embodiment, the channel layer 145 may include a semiconductor material such as polycrystalline silicon or single-crystalline silicon. The semiconductor material, included in the channel layer 145, may not be doped with an impurity, or may be doped with a p-type impurity or an n-type impurity. The channel layer 145 may be divided into a plurality of regions, based on an impurity concentration and/or a manufacturing method. Referring to the memory block BLKi illustrated in FIG. 2 together with FIG. 3, in the memory device 100, a single memory cell string NS11, NS12, or NS13 may be formed/configured around the channel layer 145, and a plurality of memory cell strings NS11 to NS33 may be arranged in rows and columns in the X-axis direction and the Y-axis direction.

In the memory device 100 according to an example embodiment, the separation region SR may extend in the first direction, and may penetrate through the gate electrodes 130 and the insulating layers 120 alternately stacked. The separation region SR may extend in a second direction (for example, the Y direction) parallel to the upper surface of the first semiconductor substrate 101. The separation region SR may include or be formed of an insulating material. As an example, the separation region SR may include or be formed of a silicon oxide, or the like. As an example, the gate electrodes 130 may be disposed to be separated by the separation region SR in a third direction (for example, the X direction). The gate electrodes 130, disposed between the plurality of separation regions SR, may constitute a single memory block. However, this is only an example and the definition of one memory block is not limited thereto.

The memory cell region CELL of the memory device 100 may further include a first interlayer insulating layer 160, a second interlayer insulating layer 165, a contact plug 170 electrically connected to the channel structures CH, and a bit line 180 electrically connected to the contact plug 170. As an example, the first interlayer insulating layer 160 and the second interlayer insulating layer 165 may cover the insulating layers 120 and the gate electrodes 130, and may include or be formed of an insulating material such as a silicon oxide. The contact plug 170 may penetrate through the first interlayer insulating layer 160 and the second interlayer insulating layer 165 to electrically connect the bit lines 180, disposed on the second interlayer insulating layer 165, and the channel structures CH to each other. The bit line 180 illustrated in FIG. 3 may correspond to the bit lines BL1, BL2, and BL3 illustrated in the circuit diagram of FIG. 1.

The memory device 100 according to an embodiment may be manufactured by forming the peripheral circuit region PERI and then forming the first semiconductor substrate 101 of the memory cell region CELL on the peripheral circuit region PERI. The first semiconductor substrate 101 may have the same size as the second semiconductor substrate 102 of the peripheral circuit region PERI, or may be formed to have a smaller size than the second semiconductor substrate 102.

The peripheral circuit region PERI may include a second semiconductor substrate 102, circuit elements disposed on the second semiconductor substrate 102 and driving a memory cell, circuit contact plugs, and a plurality of metal lines LM1 and LM2. As an example, circuit elements included in the peripheral circuit region PERI may include planar transistors. Each of the circuit elements may include a circuit gate dielectric layer, a spacer layer, and a circuit gate electrode, and source/drain regions may be disposed in the second semiconductor substrate 102 on opposite sides adjacent to the circuit gate electrode.

In the memory device 100 according to the present disclosure, the plurality of metal lines LM1 and LM2 may include an upper metal line LM2 and a lower metal line LM1. The plurality of metal lines LM1 and LM2 are metal lines disposed below the memory cells, and may be distinguished from metal lines disposed above the memory cells. According to an example embodiment, among the plurality of metal lines LM1 and LM2 disposed below the memory cells, metal lines disposed to be close to the memory cell may be defined as the upper metal line LM2, and metal lines disposed to be distant from the memory cell may be defined as the lower metal line LM1. As an example, the upper metal line LM2 may be disposed at a first height above the second semiconductor substrate 102, and the lower metal line LM1 may be disposed at a second height above the second semiconductor substrate 102 lower than the first height. The upper metal line LM2 and the lower metal line LM1 may extend in respective directions, perpendicular to each other. As an example, at least some of the plurality of metal lines LM1 and LM2 may extend in a second direction, parallel to the first and second semiconductor substrates 101 and 102. On the other hand, the remainder of the plurality of metal lines LM1 and LM2 may extend in a third direction, parallel to the first and second semiconductor substrates 101 and 102 and perpendicular to the second direction. However, this is only an example, and the arrangement and shape of the plurality of metal lines LM1 and LM2 are not limited to those described above and/or illustrated in FIG. 3. According to example embodiments, the plurality of metal lines LM1 and LM2 may include only lower metal lines LM1, or may further include another metal line disposed at a third height, other than the first height and the second height. As an example, the memory device 100 may further include another metal line disposed at the third height lower than the second height, and the other metal line may include a metal structure used as a pin. For example, the pin may be a terminal configured to be connected to an outer device. The memory device 100 may further include a plurality of metal layers disposed at various heights. However, this is only an example, and a height at which the plurality of metal lines are disposed and a structure of the plurality of metal lines are not limited to the ones described above or to those of the plurality of metal lines LM1 and LM2.

The memory cell region CELL and the peripheral circuit region PERI may be connected to each other in a region, not illustrated. For example, in the memory device 100 according to an example embodiment, the peripheral circuit region PERI may be electrically connected to the memory cell region CELL through a connection portion. According to an example embodiment, the memory cell region CELL may be electrically connected to the circuit elements of the peripheral circuit region PERI through the connection portion and a plurality of metal lines. As an example, the connection portion may be a through-hole via (THV). As an example, the connection portion may extend in the first direction, perpendicular to the first and second semiconductor substrates 101 and 102, through a space disposed on a side surface of the first semiconductor substrate 101. However, this is only an example and the present disclosure is not be limited thereto. An extending length of the connection portion may vary depending on a height of an upper surface of the common source line including or formed of the first semiconductor substrate 101, the first conductive layer 104, and the second conductive layer 105. As an example, as the height of the upper surface of the common source line is increased, a length of the connection portion may be increased.

FIGS. 4A to 4D are views illustrating a method of reducing coupling noise in a memory device according to example embodiments.

Figure 4A:
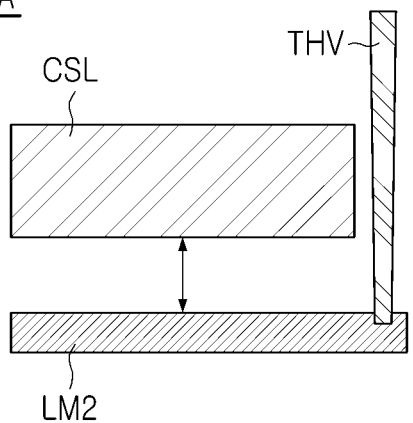
FIGS. 4A to 4D are views illustrating a method of reducing coupling noise in a memory device according to example embodiments.

FIG. 4A is a schematic enlarged view of region 100A illustrated in FIG. 3, and FIGS. 4B to 4D may be views illustrating alternative structures of a portion of the memory device illustrated in FIG. 4A to reduce coupling capacitance.

Referring to FIG. 4A, a common source line CSL, included in a memory cell region, and a plurality of upper metal lines LM2, included in a peripheral circuit region, may include a conductive material. The common source line CSL may be in the form of a plate shape (e.g., horizontal extending in X and Y directions) to have a shape covering the plurality of upper metal lines LM2 overall. Accordingly, coupling capacitance may be formed between the common source line CSL and the plurality of upper metal lines LM2. Therefore, when a high voltage is applied to the common source line CSL and signals are transmitted to the plurality of upper metal lines LM2 during an operation of the memory device, the coupling capacitance may affect signals, applied to the plurality of upper metal lines LM2, to generate coupling noise. A semiconductor chip, including a memory device, may encounter difficulty in performing a normal operation due to the coupling noise generated during the operation of the memory device.

A plurality of upper metal lines LM2, illustrated in FIGS. 4A to 4D, may be metal lines disposed on an uppermost layer, among layers including metal lines disposed below the memory cells. For example, the plurality of upper metal lines LM2 may be disposed at a first height above/on an upper surface of the second semiconductor substrate included in the peripheral circuit region. The plurality of lower metal lines LM1 may be metal lines disposed at a second height lower than the first height at which the plurality of upper metal lines LM2 are disposed.

Figure 4B:
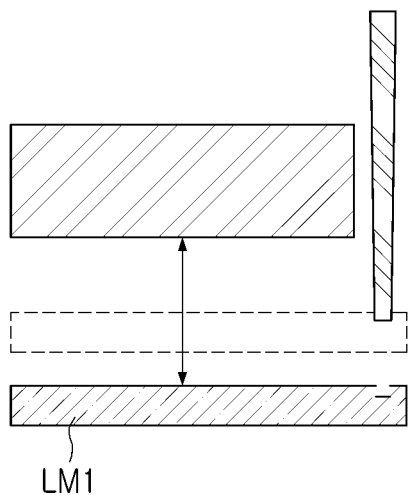

Referring to FIG. 4B, in order for the memory device according to an example embodiment to reduce the coupling noise, the plurality of upper metal lines LM2 may not be used for significant/sensitive signals because the upper metal lines LM2 may be affected by coupling capacitance. As an example, the significant/sensitive signals may be transmitted using the plurality of lower metal lines LM1, rather than the plurality of upper metal lines LM2. Accordingly, a distance between the common source line CSL and the lower metal line LM1, transmitting a significant/sensitive signal, may be increased and the magnitude of the coupling capacitance may be decreased. Accordingly, the coupling noise may be reduced to improve operational stability of the memory device.

Signals, applied to the plurality of metal lines LM1 and LM2, may include a first signal and a second signal different from the first signal. As an example, the first signal may be a significant/sensitive signal relatively more affected by the coupling capacitance. As an example, the first signal may include a reference voltage for operating the memory device according to an example embodiment. As an example, the reference voltage included in the first signal may include a bandgap reference (BGR) signal. The BGR signal may correspond to a first signal/operation of applying the reference voltage. Therefore, the coupling noise generated by the coupling capacitance in the first signal may be amplified through an amplifier, and may be relatively more significant/sensitive than coupling noise generated by the coupling capacitance in the second signal.

However, when a coupling noise issue is addressed using the method illustrated in FIG. 4B, the plurality of upper metal lines LM2 may not be used. Thus, the degree of freedom in layout may be decreased.

Figure 4C:
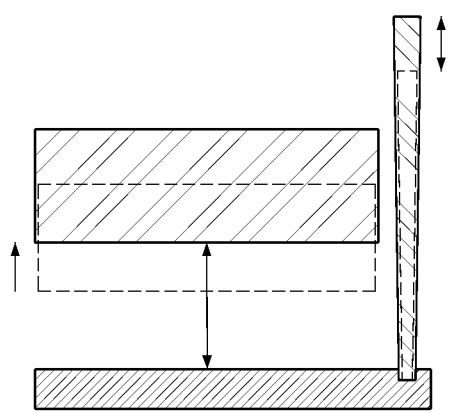

Referring to FIG. 4C, in order for the memory device according to an example embodiment to reduce the coupling noise, a common source line CSL and at least one of a plurality of upper metal lines LM2 may be moved to increase a distance therebetween. Thus, the magnitude of the coupling capacitance and coupling noise may be reduced to improve operational stability of the memory device.

However, when the method illustrated in FIG. 4C is used, as a length of the connection portion THV is increased, resistance of the connection portion THV and coupling resistance between opposing connection portion THV may be increased and difficulty of a process of forming the connection portion THV may be increased.

Figure 4D:
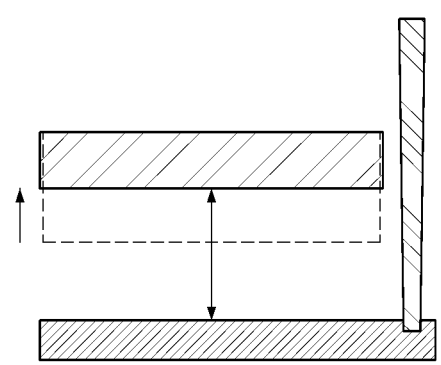

Referring to FIG. 4D, in order for the memory device according to an example embodiment to reduce the coupling noise while addressing an issue of increasing the length of the connection portion THV occurring in FIGS. 4B and 4C, a thickness of the common source line CSL may be decreased. Accordingly, a distance between the common source line CSL and the plurality of upper metal lines LM2 may be increased while maintaining the length of the connection portion THV, and the magnitude of the coupling capacitance and the coupling noise may be reduced.

However, when the method illustrated in FIG. 4D is used, as the thickness of the common source line CSL is decreased, resistance of the common source line CSL may be increased. However, the magnitude of the resistance of the common source line CSL may have a direct relation to performance of a semiconductor chip including the memory device. Accordingly, there may be demand for a method of reducing the magnitude of the coupling capacitance and coupling noise while maintaining the magnitude of the resistance of the common source line CSL.

Figure 5:
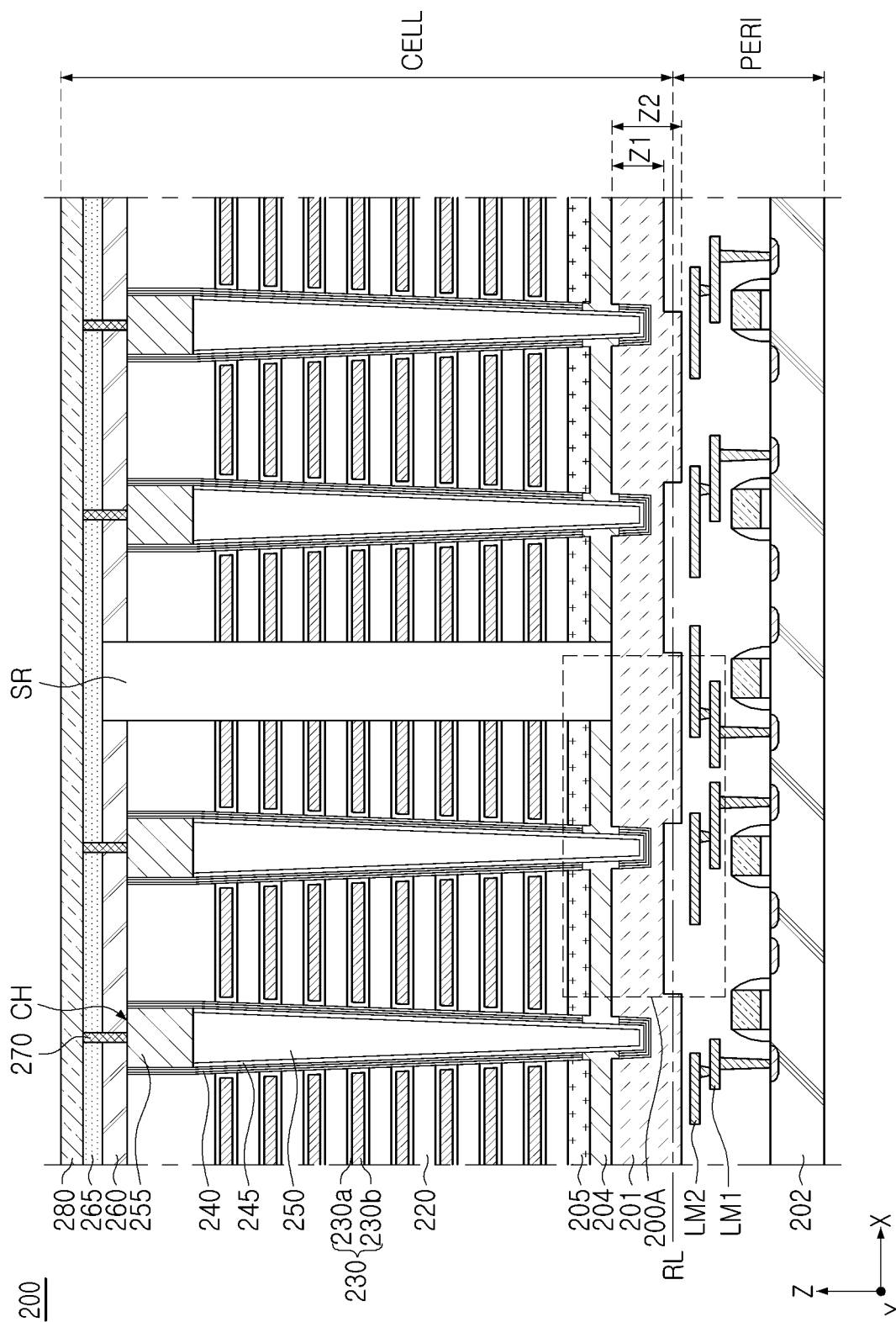
FIG. 5 is a cross-sectional view of a memory device according to an example embodiment.

FIG. 5 is a cross-sectional view of a memory device according to an example embodiment.

Referring to FIG. 5, a memory device 200 according to an example embodiment may include components, respectively corresponding to the components of the memory device 100 illustrated in FIG. 3. As an example, a memory cell region CELL of the memory device 200 according to the example embodiment may include a first semiconductor substrate 201, a plurality of insulating layers 220, a plurality of gate electrodes 230, a first conductive layer 204, a second conductive layer 205, channel structures CH, and a separation region SR. In addition, a peripheral circuit region PERI of the memory device 200 may include a second semiconductor substrate 202, circuit elements disposed on the second semiconductor substrate 202, circuit contact plugs, and a plurality of metal lines LM1 and LM2.

Unlike the memory device 100 illustrated in FIG. 3, the memory device 200 according to an example embodiment may include a plate-shaped first semiconductor substrate 201 having a curved lower surface or a protruding and recessed surface. As an example, the first semiconductor substrate 201 may function as a common source line together with the first conductive layer 204 and the second conductive layer 205. Referring to FIG. 3 together with FIG. 5, a lower surface of the common source line in the memory device 100 may correspond to a reference line RL of the common source line in the memory device 200 illustrated in FIG. 5. As described above, the first semiconductor substrate 101, the first conductive layer 104, and the second conductive layer 105 may be defined as a common source line.

As an example, the protruding and recessed bottom surface of the first semiconductor substrate 201 included in the memory device 200 may be formed from an interlayer insulating layer in the peripheral circuit region PERI. For example, a thickness of the first semiconductor substrate 201 may be adjusted by etching a portion of the interlayer insulating layer and forming the first semiconductor substrate 201 on the etched surface of the interlayer insulating layer of the peripheral circuit region PERI. However, this is only an example and the present disclosure is not limited thereto. As an example, the first semiconductor substrate 201 may include first regions, having a first thickness Z1 in a first direction, and second regions having a second thickness Z2 greater than the first thickness Z1.

In the memory device 200 according to an example embodiment, the first regions and the second regions may be alternately disposed in a third direction (for example, an X direction), parallel to the first semiconductor substrate 201 and the second semiconductor substrate 202. In the first semiconductor substrate 201 including a plurality of regions having different thicknesses, the first regions may be provided to reduce coupling capacitance with a plurality of metal lines LM1 and LM2 disposed thereunder. On the other hand, the second regions may be provided to maintain overall resistance of the first semiconductor substrate 201. For example, thicknesses of the first regions and the second regions of the first semiconductor substrate 201 may be adjusted by a target resistance value of the first semiconductor substrate 201. As an example, the target resistance value may be a resistance value of the first semiconductor substrate 101 when a lower surface of the first semiconductor substrate 101 is disposed on a reference line RL, an imaginary line, in the memory device 100 illustrated in FIG. 3. As an example, in the memory device 200 according to an example embodiment, the first semiconductor substrate 201 may include a lower surface having a plurality of regions, each having a lower surface formed to be higher or lower than the virtual reference line RL.

In the memory device 200 illustrated in FIG. 5, at least two upper metal lines LM2 may be disposed below a first region and another first region adjacent to the first region. However, this is only an example and the present disclosure is not limited thereto, and the first semiconductor substrate 201 and the plurality of upper metal lines LM2 may be disposed in various ways according to example embodiments.

Figure 6:
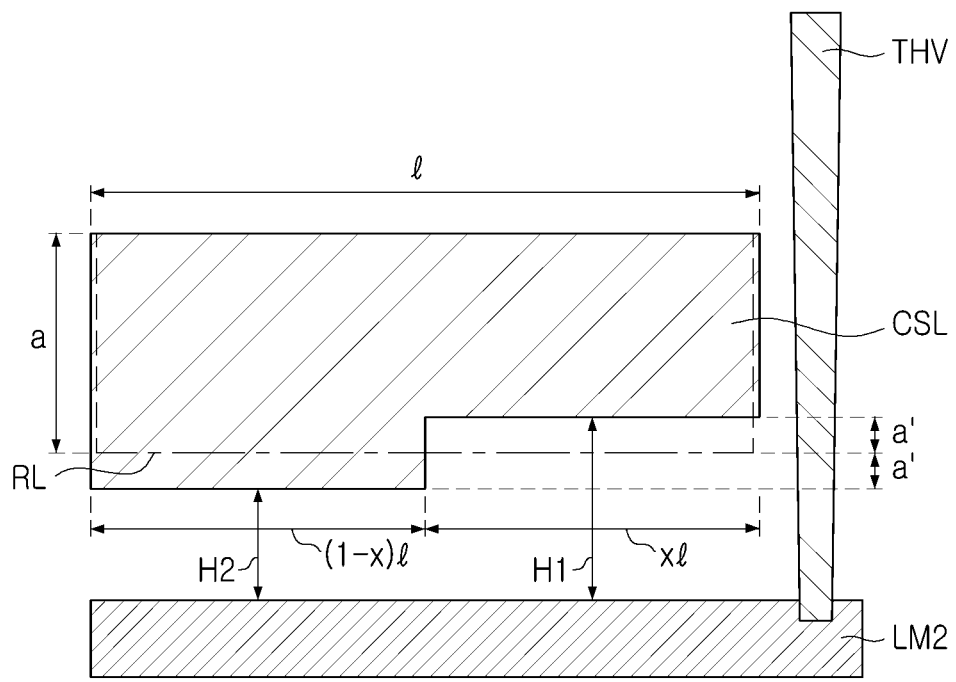
FIG. 6 is a view illustrating a method of adjusting coupling capacitance in a memory device according to an example embodiment.

FIG. 6 is a view illustrating a method of adjusting coupling capacitance in a memory device according to an example embodiment.

FIG. 6 is a schematic enlarged view of region 200A illustrated in FIG. 5. As an example, the memory device 200 according to an example embodiment may include a common source line CSL having a stepped/curved lower surface. A curvature of the lower surface of the common source line CSL may be defined based on a reference line RL corresponding to the planar lower surface of the common source line CSL illustrated in FIG. 4A. The degree of the curvature and/or a depth of steps of the lower surface of the common source line CSL may be determined depending on coupling capacitance to be reduced. As an example, coupling capacitance formed between an upper metal line LM2, through which a significant/sensitive signal is transmitted, and the common source line CSL should be reduced by and/or maintained at a certain level or less such that coupling noise for the significant/sensitive signal is maintained at a predetermined level or less. As an example, a space between the upper metal line LM2 and the common source line CSL needs to be further secured to significantly reduce the coupling capacitance, causing the degree of the curvature (e.g., height of protrusions or a depth of recesses) to be increased.

In the enlarged region 200A of the memory device 200 illustrated in FIG. 6, based on a reference line RL, a thickness of the common source line CSL in the first regions may be a-a' and a thickness of the common source line CSL in the second regions may be a+a'. In a direction perpendicular to the reference line RL, an overall width of the common source line CSL may be "1," and widths of the first region and the second region may be x×1 and (1−x)×1, respectively. In this case, distances between the first and second regions of the common source line CSL and the upper metal line LM2 disposed below the common source line CSL may be H1 and H2, respectively. For example, as described above, the upper metal line LM2 may be disposed at the first height above the second semiconductor substrate, so that a distance between a lower surface of the common source line CSL and an upper surface of the upper metal line LM2 in the first region may have a first value H1. On the other hand, a distance between a lower surface of the common source line CSL and an upper surface of the upper metal line LM2 in the second region may have a second value H2 less than the first value H1. The upper metal line LM2 in the first region and the upper metal lien LM2 in the second region may be disposed on the same plane extending in a horizontal direction. For example, the upper metal line LM2 in the first region and the upper metal lien LM2 in the second region may be disposed at the same height with respect to a top surface of the second semiconductor substrate. As described above, the magnitude of overall resistance of the common source line CSL should be maintained at a certain level or less, irrespective of the first value H1 and the second value H2, so that the first value H1 may be decreased when the second value H2 is increased. In contrast, the first value H1 may be increased when the second value H2 is decreased. However, this is only an example and the present disclosure is not limited thereto, and definitions of the thicknesses and widths of the common source line CSL in the first region and the second region may be changed.

In the memory device 200 according to an example embodiment, the upper metal line LM2, through which a significant/sensitive signal is transmitted, may be disposed below the first region having a relatively great distance to the common source line CSL. Coupling capacitance between the upper metal line LM2, through which the significant/sensitive signal is transmitted, and the first region of the common source line CSL may be determined by a first value H1, a distance therebetween. The first value H1 may be determined by a' representing the degree of curvature, and a' may be determined depending on required magnitude of the coupling capacitance. To maintain performance of the memory device 200, the overall resistance of the common source line CSL included in the memory device 200 may be smaller than or equal to the overall resistance of the common source line CSL included in the memory device 100 illustrated in FIG. 4A, as can be seen from Equation 1.

$$\frac{1}{a} \geq \frac{(1-x)1}{a+a`} + \frac{x1}{a-a`} \qquad \text{Equation 1}$$

In the memory device 200 according to an example embodiment, each of "a" and "1" may have a predetermined value. Therefore, when a' is determined, "x" may be determined by deriving Equation 2 from Equation 1.

$$x \leq \frac{1}{2}\left(1 - \frac{a`}{a}\right) \qquad \text{Equation 2}$$

For example, when the thickness "a" of the common source line CSL in the first region is decreased by about 10%, the first value H1, the distance between the common source line CSL and the upper metal line LM2, may be increased by about 11%, as compared with an existing value. Thus, coupling noise generated in a significant/sensitive signal by the common source line CSL may be decreased by about 11%. In this case, to prevent the performance of the memory device from being deteriorated due to an increase in the overall resistance of the common source line CSL, the thickness "a" of the common source line CSL in the second region may be increased by about 10%, and the second value H2, the distance between the common source line CSL and the upper metal line LM2, may also be increased. As an example, "x" may be 0.45. In this case, the common source line CSL may include a first region having a width of x×1, corresponding to 45% of the overall width "1," and a second region having a width of (1−x)×1 corresponding to 55% of the overall width "1."

However, this is only an example and the present disclosure is not limited thereto, and a change in the thickness of the common source line CSL and a width of each region may vary. In addition, a method of determining "x" may vary according to embodiments. For example, when the degree of decrease in thickness in the first region is different from the degree of increase in thickness in the second region, the degree of decrease in thickness in the first region may be determined by a relationship between the degree of increase in thickness in the second region and "x," and "x" may be determined based on the relationship.

FIGS. 7 to 11 are cross-sectional views of memory devices according to example embodiments.

Referring to FIGS. 7 to 11, memory devices 300, 400, . . . , and 700 according to example embodiments may include components, respectively corresponding to the components of the memory device 200 according to an example embodiment illustrated in FIG. 5. As an example, memory cell regions CELL of each of the memory devices 300, 400, . . . , and 700 according to example embodiments may include first semiconductor substrates 301, 401, . . . , and 701, a plurality of insulating layers 320, 420, . . . , and 720, a plurality of gate electrodes 330, 430, . . . , and 730, first conductive layers 304, 404, . . . , and 704, second conductive layers 305, 405, . . . , and 705, channel structures CH, and separation regions SR, respectively. Peripheral circuit regions PERI of the memory devices 300, 400 . . . , and 700 according to the example embodiments may include second semiconductor substrates 302, 402 . . . , and 702, and circuit elements, circuit contact plugs, and a plurality of metal lines LM1 and LM2 disposed above the semiconductor substrates 302, 402 . . . , and 702, respectively.

Similarly to the memory device 200 illustrated in FIG. 5, the memory devices 300, 400, . . . , and 700 according to the example embodiments may include plate-shaped first semiconductor substrates 301, 401, . . . , and 701 having curved lower surfaces, respectively. However, a shape of the curvature may be different for each example embodiment, and may be determined in overall consideration of selection of a curvature and the degree of process difficulty and performance improvement. As described above, the first semiconductor substrates 301, 401 . . . , and 701, the first conductive layers 304, 404 . . . , and 704, and the second conductive layers 305, 405 . . . , and 705 may be defined as a common source line. The first semiconductor substrates 301, 401 . . . , and 701 may be defined as referring to an overall configuration disposed adjacent to the first semiconductor substrates 301, 401 . . . , and 701 to function as a common source line.

The memory devices 300, 400 . . . , and 700 according to example embodiments may include a plurality of upper metal lines LM2 extending in a second direction (a Y direction) parallel to the second semiconductor substrate 302, 402 . . . , and 702, respectively. The plurality of upper metal lines LM2 may be disposed at a first height above the second semiconductor substrates 302, 402 . . . , and 702, and a plurality of lower metal lines LM1 may be disposed at a second height lower than the first height. As an example, a first signal may include a reference voltage for operating the memory devices 300, 400 . . . , and 700 according to example embodiments. As an example, the first signal may include a bandgap reference signal.

Each of the first semiconductor substrate 301, 401 . . . , and 701, may include first regions, in which a distance between a lower surface thereof and an upper surface of the plurality of upper metal lines LM2 has a first value, and second regions having a second value (distance), lower than the first value. For example, a thickness of the first regions may be smaller than a thickness of the second regions. The first regions and the second regions may be alternately disposed in a third direction.

Among the plurality of upper metal lines LM2, first metal lines, through which the first signal is transmitted, may be disposed below the first regions. First coupling capacitance may be formed between the first semiconductor substrates 301, 401 . . . , and 701 and the first metal lines, and second coupling capacitance may be formed between the first semiconductor substrates 301, 401 . . . , and 701 and the second metal lines. As an example, the first coupling capacitance for the first metal lines, disposed below the first regions, may be less than the second coupling capacitance for the second metal lines. However, this is only an example and the present disclosure is not limited thereto, and second coupling capacitance, less than the first coupling capacitance, may be formed.

Figure 7:
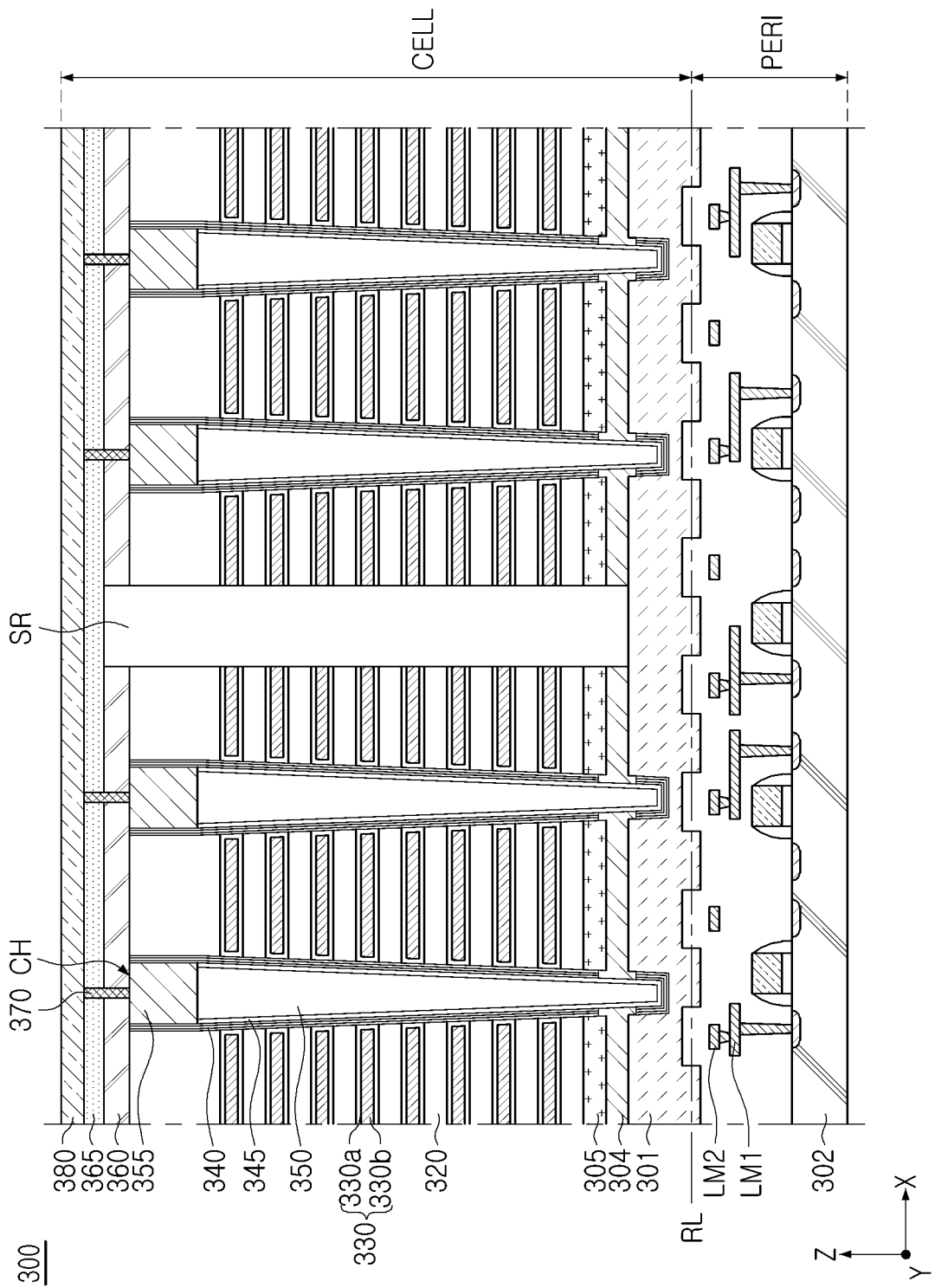
FIGS. 7 to 11 are cross-sectional views of memory devices according to example embodiments.

Referring to FIG. 7, in the memory device 300 according to an example embodiment, a distance between a pair of first regions adjacent to each other in a third direction, among the first regions, may be equal to a distance between a pair of upper metal lines adjacent to each other in the third direction, among the plurality of upper metal lines LM2. For example, a single upper metal line LM2 may be disposed in each of the first regions disposed alternately with second regions. Among all of the upper metal lines LM2, one or more upper metal lines LM2 may be first metal lines through which the first signal is transmitted. Accordingly, coupling capacitance for all of the upper metal lines LM2 may be reduced. However, a lower surface of the first semiconductor substrate 301 is not limited to that illustrated in FIG. 7, and may be formed to have various shapes. As an example, a pair of first regions adjacent to each other, among the first regions, and a pair of second regions adjacent to each other, among the second regions, may each have the same length in the third direction. For example, the number of the plurality of first regions may be equal to the number of the plurality of second regions. For example, the sum of lengths of the plurality of first regions in the third direction may be equal to the sum of lengths of the plurality of second regions in the third direction.

Figure 8:
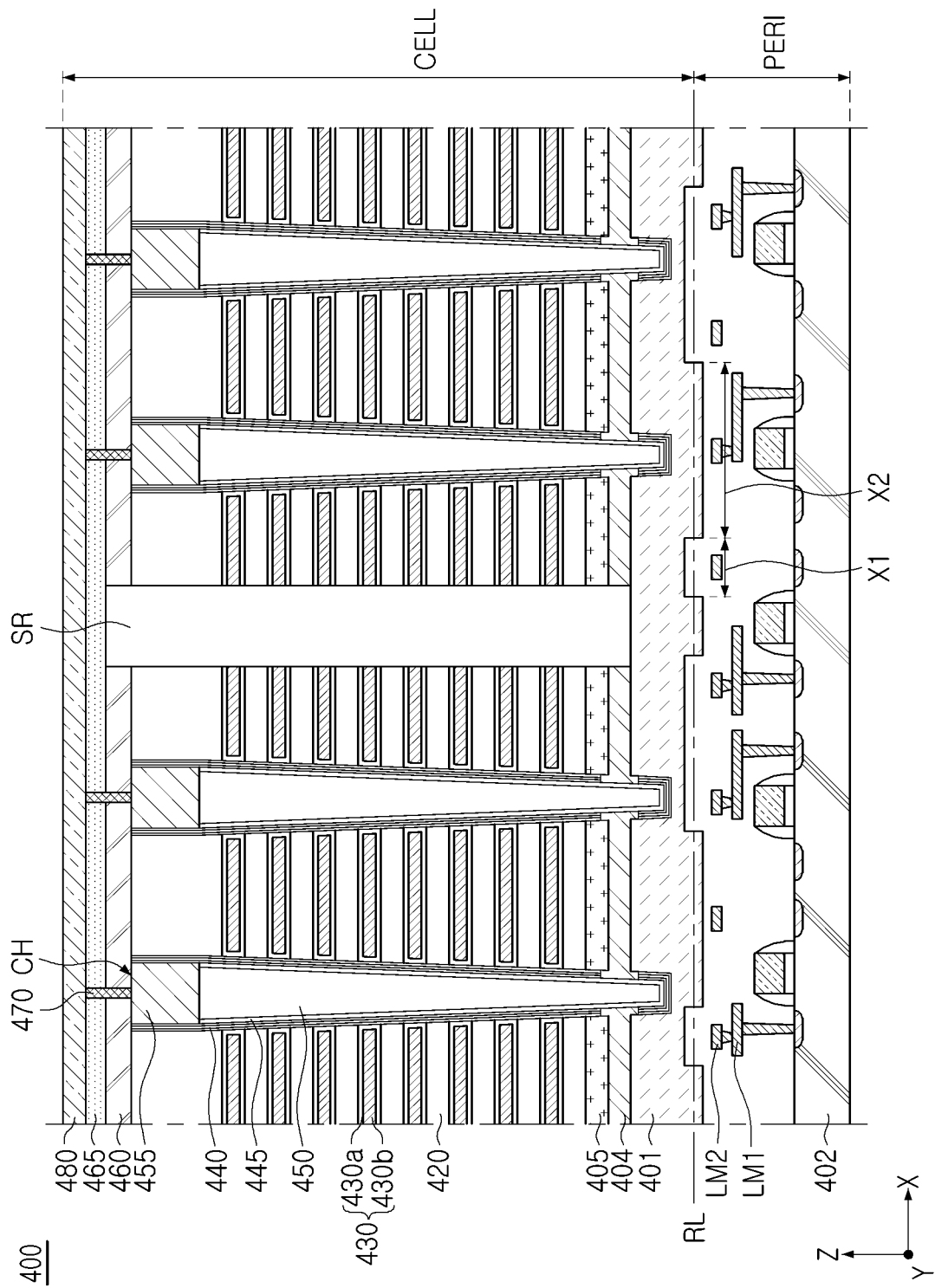

Referring to FIG. 8, in the memory device 400 according to an example embodiment, at least some of the first and second regions alternately disposed in a third direction (for example, an X direction) may have different lengths. For example, in the memory device 200 according to the example embodiment illustrated in FIG. 5, at least two upper metal lines LM2 may be disposed below a portion between a pair of first regions adjacent in the third direction, among the first regions. For example, a second region interposed between adjacent two first regions may vertically overlap two or more upper metal lines LM2 in an embodiment of the present disclosure as illustrated in FIG. 5. In the memory device 400 according to an example embodiment, the first regions disposed alternately with the second regions may have different lengths in the third direction. Similarly, the second regions may have different lengths from each other. As an example, some of the first regions and the second regions may have a length X1 in the third direction, and other regions of the first regions and the second regions may have a length X2, different from the length X1, in the third direction. Accordingly, one of the plurality of upper metal lines LM2 may be disposed below some of the first regions, and at least two upper metal lines LM2 may be disposed below other regions. For example, some of the first regions may vertically overlap with one upper metal line LM2, and some others of the first regions may vertically overlap with two upper metal lines LM2. In the memory device 400 according to an example embodiment illustrated in FIG. 8, at least one of the first regions may be adjacent to a second region having the same length on a first side in the third direction, and may be adjacent to a second region having a different length on a second side in the third direction. However, the present disclosure is not limited to that illustrated in FIG. 8, and the first regions and the second regions may be formed in various combinations and methods based on the contents of the present specification.

Figure 9:
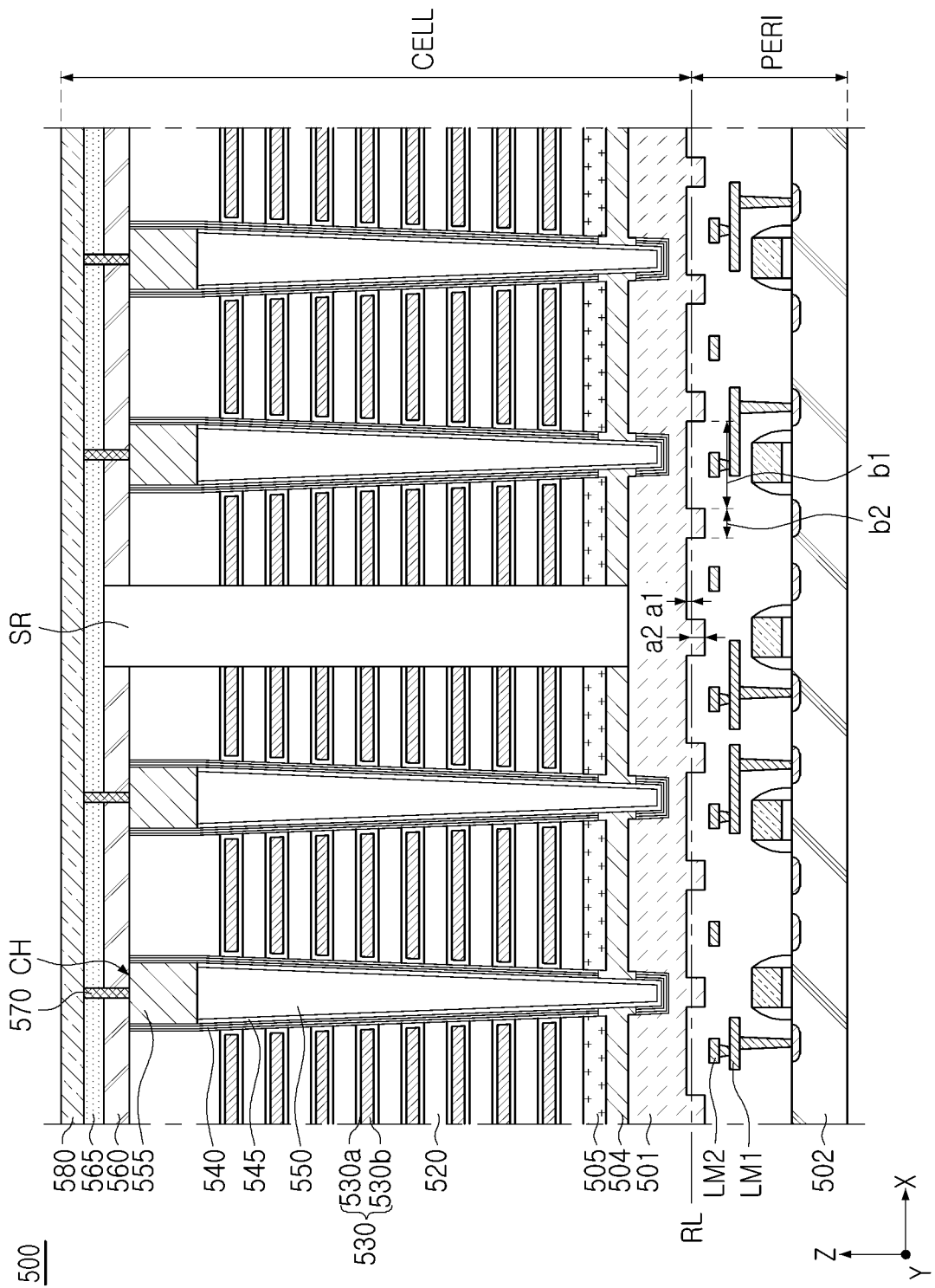

Referring to FIG. 9, in the memory device 500 according to an example embodiment, a first region and a second region adjacent to each other may have different lengths in a third direction. As an example, a thickness of the first regions may be decreased in a first direction based on a reference line RL, and a thickness of the second regions may be increased in the first direction based on the reference line RL. According to what is illustrated in FIGS. 5 to 8, the thickness decreased in the first regions and the thickness increased in the second regions are illustrated as being the same, but the present disclosure is not limited thereto. As an example, as described with reference to FIG. 6, the thickness increased or decreased in the first regions and the second regions and lengths of the first regions and the second regions in the third direction may have a predetermined relationship. As an example, the first regions and the second regions may be formed such that the overall resistance of the first semiconductor substrate 401 is maintained to be smaller than or equal to a predetermined value.

A first semiconductor substrate 501 included in the memory device 500 according to the example embodiment of FIG. 9 may have a thickness "a1" decreased in the first regions and a thickness "a2" increased in the second regions, and the thickness "a2" may be greater than the thickness "a1" In a third direction, a length "b1" of the first regions may be greater than a length "b2" of the second regions. Accordingly, the first regions and the second regions may have different shapes, but may be formed such that the magnitude of overall resistance of the first semiconductor substrate 501 is maintained to be smaller than or equal to an existing magnitude. However, the present disclosure is not limited to what is illustrated in FIG. 9, and the first regions and the second regions may be formed to have various shapes.

Figure 10:
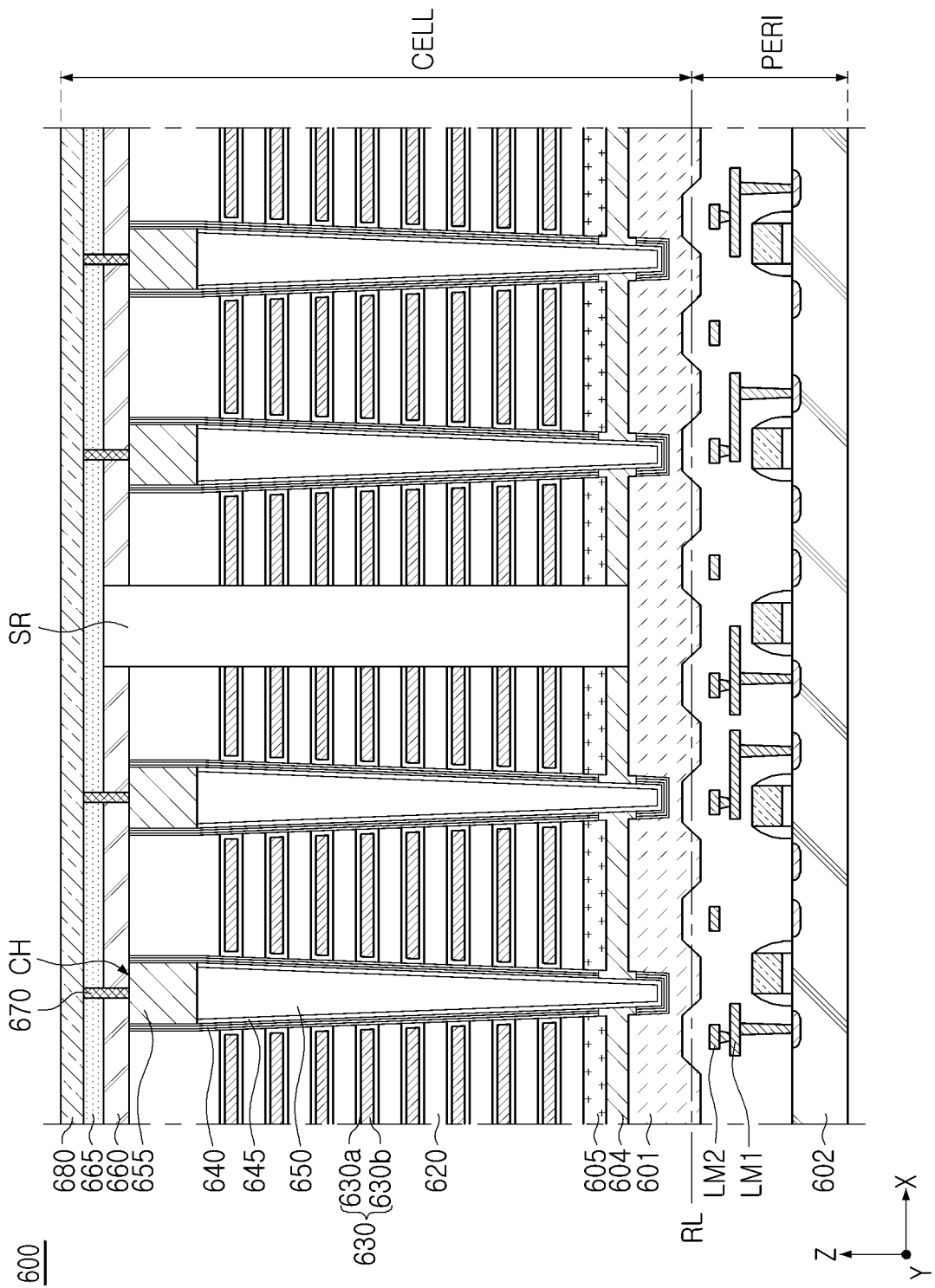
Figure 11:
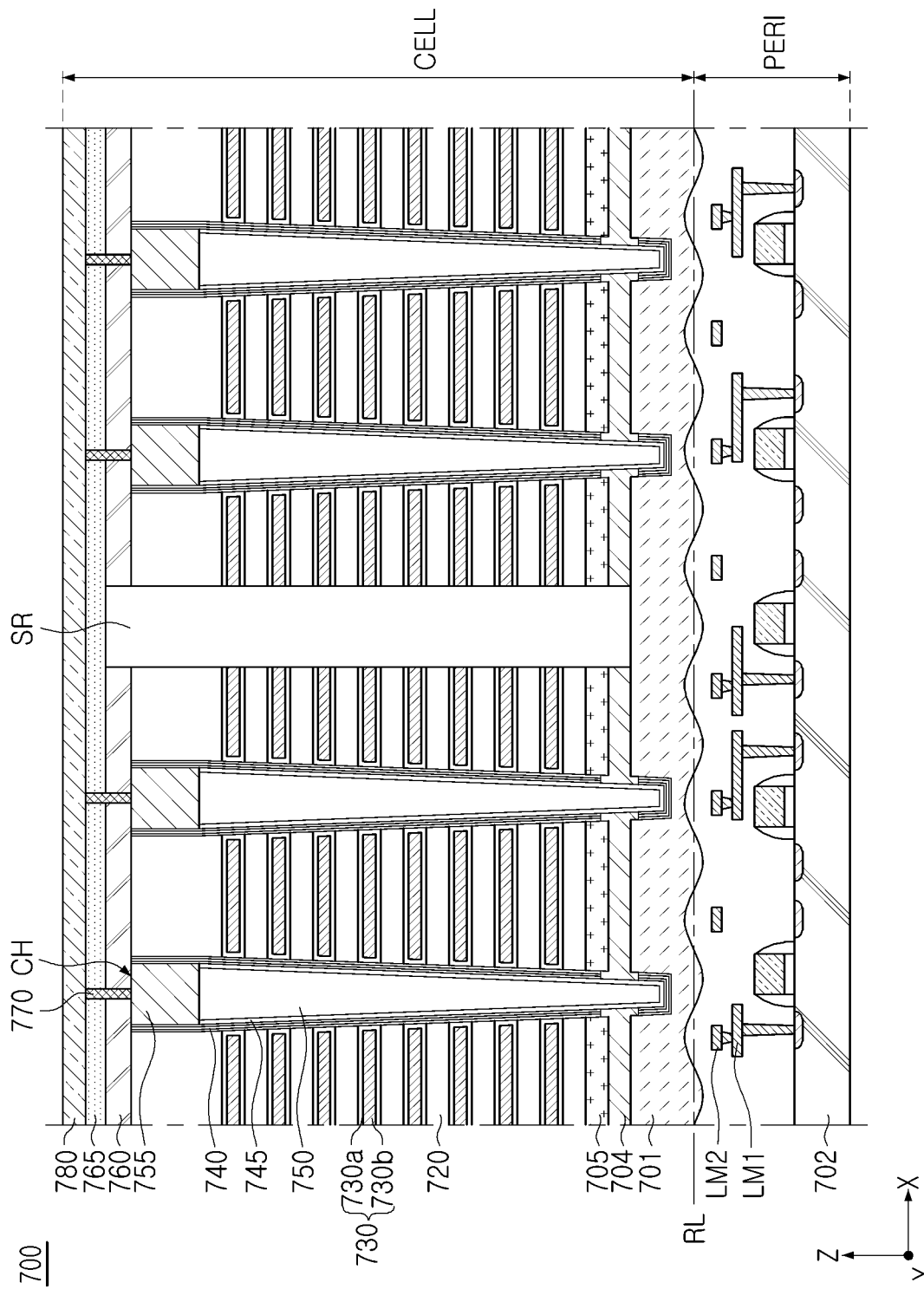

Referring to FIGS. 10 and 11, the memory devices 600 and 700 according to example embodiments may further include third regions in which a distance between a predetermined height, at which a lower surface of semiconductor substrates 601 and 701 is disposed, and a first height above second semiconductor substrate 602 and 702 has a third value between a first value and a second value. For example, a thickness of each of the first semiconductor substrates 601 and 701 in the third regions may have a value between a thickness of the first regions and a thickness of the second regions. The third regions may be formed such that the third value is continuously changed in the third direction. For example, the thickness of the third regions of the first semiconductor substrates 601 and 701 may vary along the third direction. As an example, the memory device 600 according to an example embodiment of FIG. 10 may include third regions in which the third value is continuously changed based on a constant change rate. Accordingly, the first semiconductor substrate 601 may have a lower surface inclined in the third regions. On the other hand, the memory device 700 according to the embodiment of FIG. 11 may include third regions in which the third value is continuously changed in a wave form. As an example, the first semiconductor substrate 701 may have a curved (e.g., in a wave pattern) lower surface in the third regions. However, this is only an example, and the present disclosure is not limited thereto, and the third regions may be formed in overall consideration of process difficulty and performance improvement of the memory device.

Figure 12:
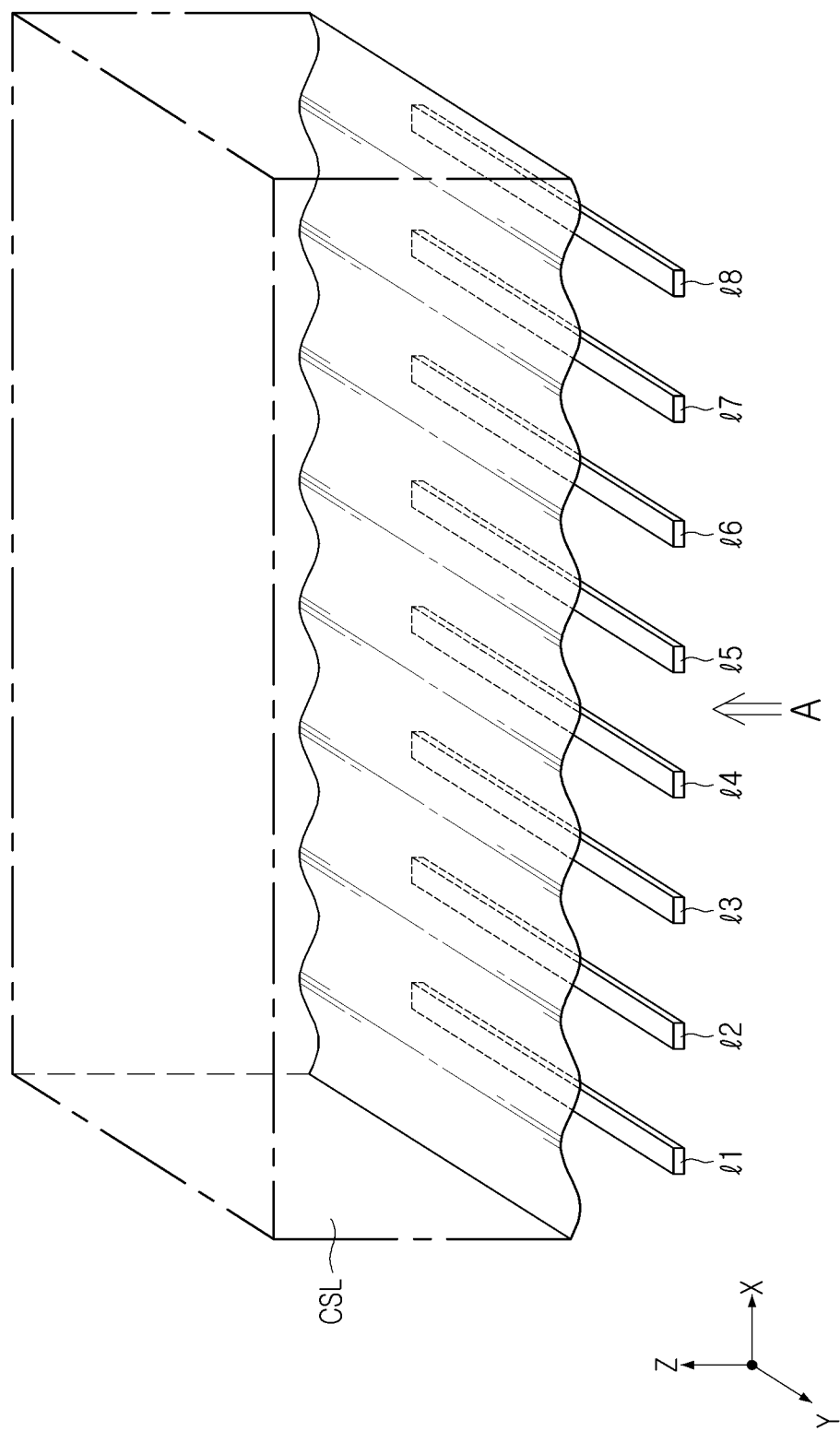
FIGS. 12 and 13 are respectively a schematic perspective view and a schematic bottom view of the memory device according to an example embodiment illustrated in FIG. 11.
Figure 13:
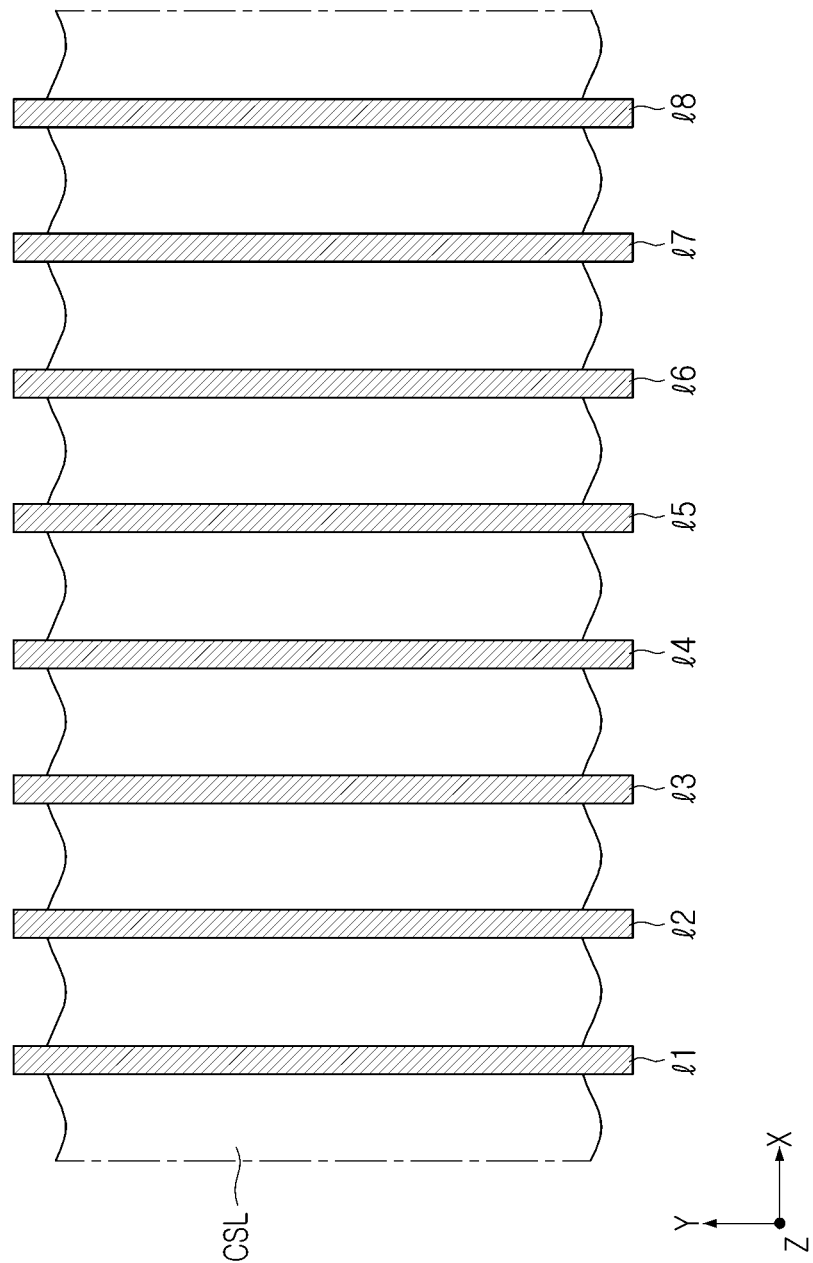

FIGS. 12 and 13 are respectively a schematic perspective view and a schematic bottom view of the memory device according to an example embodiment illustrated in FIG. 11.

FIG. 12 may is a perspective view illustrating a common source line CSL, included in the memory device 700 according to an example embodiment illustrated in FIG. 11, and a plurality of upper metal lines 11, 12 . . . , and 18 disposed below the common source line CSL. FIG. 13 is a bottom view of the embodiment of FIG. 12 when viewed in direction A.

Referring to FIGS. 12 and 13, a plurality of upper metal lines 11, 12 . . . , and 18 may be disposed below first regions to secure a space with the common source line CSL as large as possible. As described above, first metal lines, through which a first signal including a significant/sensitive signal is transmitted, may be disposed below the first regions to significantly reduce coupling noise for the first signal. Accordingly, at least one of the plurality of upper metal lines 11, 12 . . . , and 18 may include the first metal lines. The remainder of the plurality of upper metal lines 11, 12 . . . , and 18 may include a second metal line through which a second signal is transmitted. However, this is only an example and the present disclosure is not limited thereto.

Figure 14:
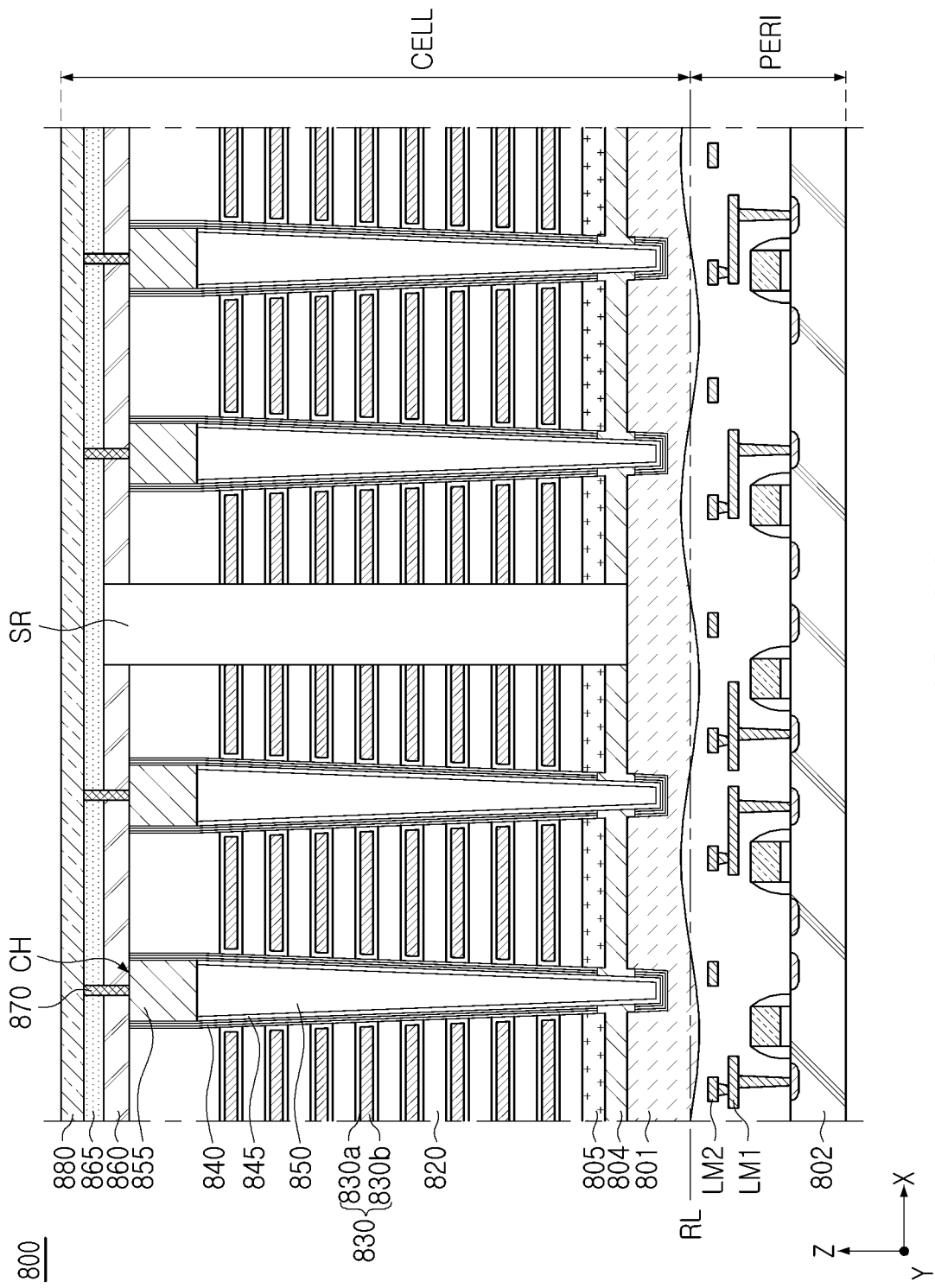
FIG. 14 is a cross-sectional view of a memory device according to an example embodiment.

FIG. 14 is a cross-sectional view of a memory device according to an example embodiment.

Referring to FIG. 14, a memory device 800 according to an example embodiment may include components, respectively corresponding to the components of the memory device 700 according to an example embodiment illustrated in FIG. 11. As an example, a memory cell region CELL of the memory device 800 according to an example embodiment may include a first semiconductor substrate 801, a plurality of insulating layers 820, a plurality of gate electrodes 830, a first conductive layer 804, a second conductive layer 805, channel structures CH, and a separation region SR. A peripheral circuit region PERI of the memory device 800 according to an example embodiment may include a second semiconductor substrate 802, and circuit elements, circuit contact plugs, and a plurality of metal lines LM1 and LM2 disposed above the second semiconductor substrate 802.

Similarly to the memory device 700 according to an example embodiment illustrated in FIG. 11, the memory device 800 according to an example embodiment may include a plate-shaped first semiconductor substrate 801 curved to have a continuously changed thickness. As described above, in the memory device 700, a distance between a first region and another first region adjacent to the first region may be equal to a distance between two adjacent upper metal lines LM2 of a plurality of upper metal lines LM2. Unlike the memory device 700, in the memory device 800 according to an example embodiment illustrated in FIG. 14, at least two upper metal lines LM2 may be disposed below a portion between a first region and another first region adjacent to the first region.

Figure 15:
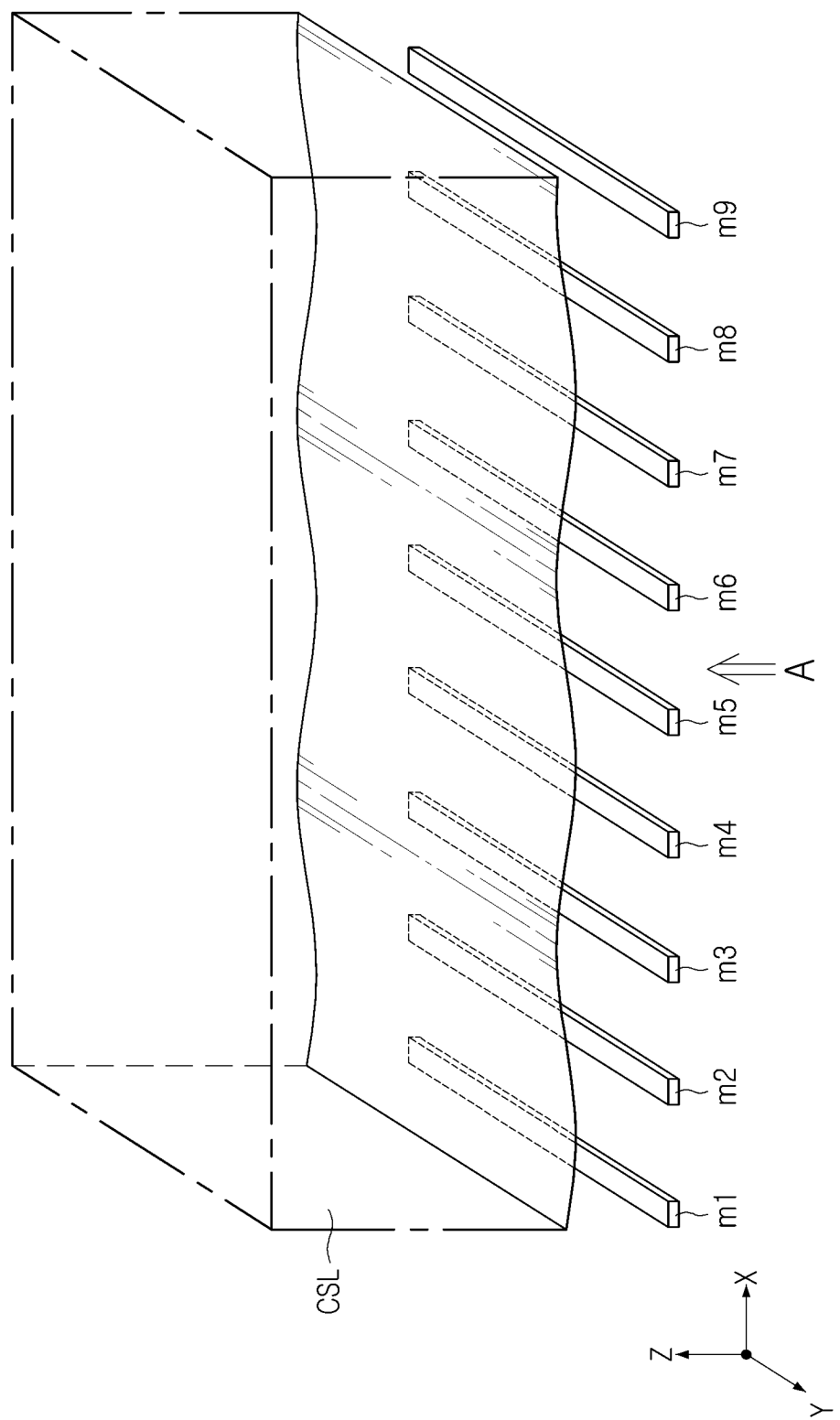
FIGS. 15 and 16 are respectively a schematic perspective view and a schematic bottom view of the memory device according to an example embodiment illustrated in FIG. 14.
Figure 16:
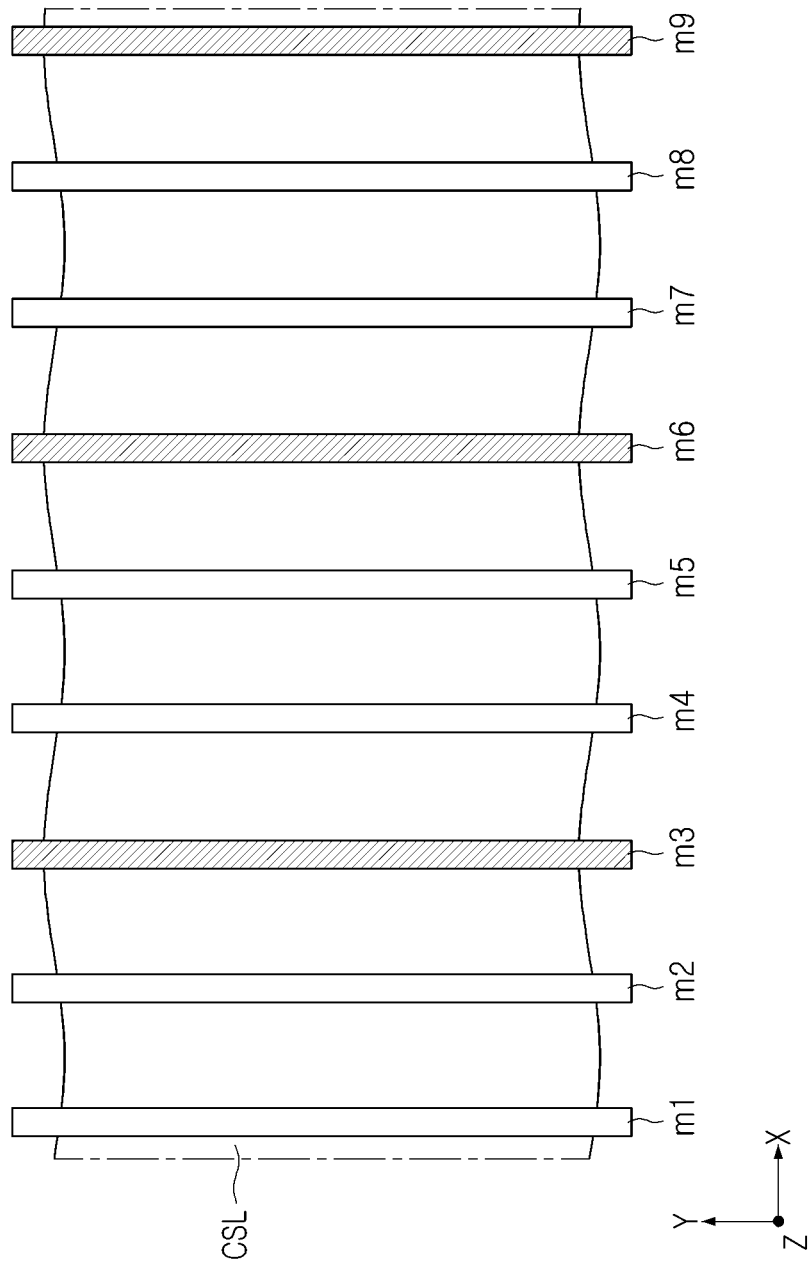

FIGS. 15 and 16 are respectively a schematic perspective view and a schematic bottom view of the memory device according to an example embodiment illustrated in FIG. 14.

FIG. 15 is a view illustrating a common source line CSL, included in the memory device 800 according to an example embodiment illustrated in FIG. 14, and a plurality of upper metal lines m1, m2 . . . , and m9 disposed below the common source line CSL. FIG. 16 is a bottom view of the embodiment of FIG. 15 when viewed in direction A.

Referring to FIGS. 15 and 16, the plurality of upper metal lines m1, m2 . . . , and m8 may be disposed below the common source line CSL. Unlike the memory device 700 according to an example embodiment illustrated in FIG. 11, some of the plurality of upper metal lines m1, m2, . . . and m8 may be disposed below first regions, and the remainder thereof may be disposed below second regions or third regions. As an example, among the plurality of upper metal lines m1, m2 . . . , and m8, metal lines m3, m6, and m9 disposed below the first regions may be included in a first group. Among the plurality of upper metal lines m1, m2 . . . , and m8, metal lines m2, m4, m5, m7, and m8 disposed below the second regions may be included in a second group.

First metal lines, through which a first signal including a significant/sensitive signal is transmitted, may be disposed below the first regions to significantly reduce coupling noise for the first signal. Accordingly, at least one of the metal lines m3, m6, and m9 included in the first group may include or be the first metal lines. Among the metal lines m3, m6, and m9 included in the first group, the remainder may include a second metal line through which a second signal is transmitted. In addition, at least one of the metal lines m1, m2, m4, m5, m7, and m8 included in the second group may include the second metal line. However, this is only an example and the present disclosure is not limited thereto, and the first metal lines may be disposed in a portion of the third regions, rather than the first regions, according to certain embodiments. In addition, the plurality of upper metal lines m1, m2 . . . , and m8 may not include the first metal lines.

Figure 17:
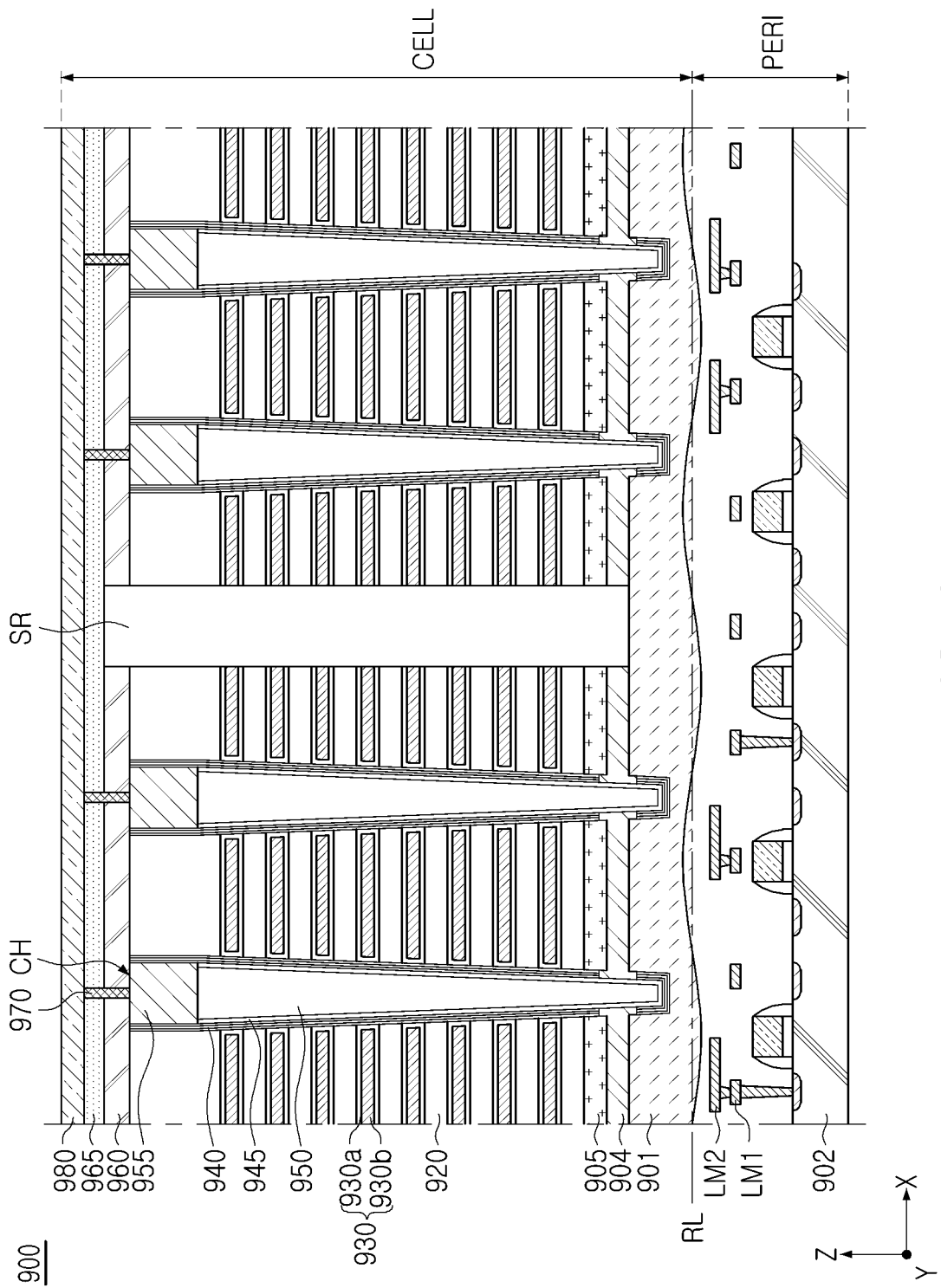
FIG. 17 is a cross-sectional view of a memory device according to an example embodiment.

FIG. 17 is a cross-sectional view of a memory device according to an example embodiment.

Referring to FIG. 17, a memory device 900 according to an example embodiment may include components, respectively corresponding to the components of the memory device 800 according to an example embodiment illustrated in FIG. 14. As an example, a memory cell region CELL of the memory device 900 according to an example embodiment may include a first semiconductor substrate 901, a plurality of insulating layers 920, a plurality of gate electrodes 930, a first conductive layer 904, a second conductive layer 905, a channel structures CH, and a separation region SR. In addition, a peripheral circuit region PERI of the memory device 900 according to an example embodiment may include a second semiconductor substrate 902, and circuit elements, circuit contact plugs, and a plurality of metal lines LM1 and LM2 disposed above the second semiconductor substrate 902.

Similarly to the memory device 800 according to an example embodiment illustrated in FIG. 14, the memory device 900 according to an example embodiment may include a plate-shaped first semiconductor substrate 901 curved to have a continuously changed (e.g., varying) thickness. However, an extending direction of the plurality of metal lines LM1 and LM2, included in the memory device 800 according to the embodiment illustrated in FIG. 14, and an extending direction of the plurality of metal lines, included in the memory device 900 according to the embodiment illustrated in FIG. 17, may be perpendicular to each other, e.g., with respect to other elements/circuit formed in the memory devices 800 and 900. As an example, in the memory device 800 according to an example embodiment illustrated in FIG. 14, a plurality of upper metal lines LM2 may extend in a second direction, and a plurality of lower metal lines LM1 may extend in in a third direction, perpendicular to the second direction. On the other hand, in the memory device 900 according to an example embodiment illustrated in FIG. 17, a plurality of upper metal lines LM2 may extend in a third direction, and a plurality of lower metal lines LM1 may extend in a second direction.

Accordingly, unlike the memory device 800 in which at least two upper metal lines LM2 may be disposed below a portion between first regions adjacent to each other, the memory device 900 according to an example embodiment may include at least two lower metal lines disposed below a portion between first regions adjacent to each other. However, this is only an example and the present disclosure is not limited thereto. In addition, the first metal lines, through which a first signal including a significant/sensitive signal is transmitted, may be included in at least one of the plurality of metal lines LM1 and LM2, but the present disclosure is not limited thereto.

Figure 18:
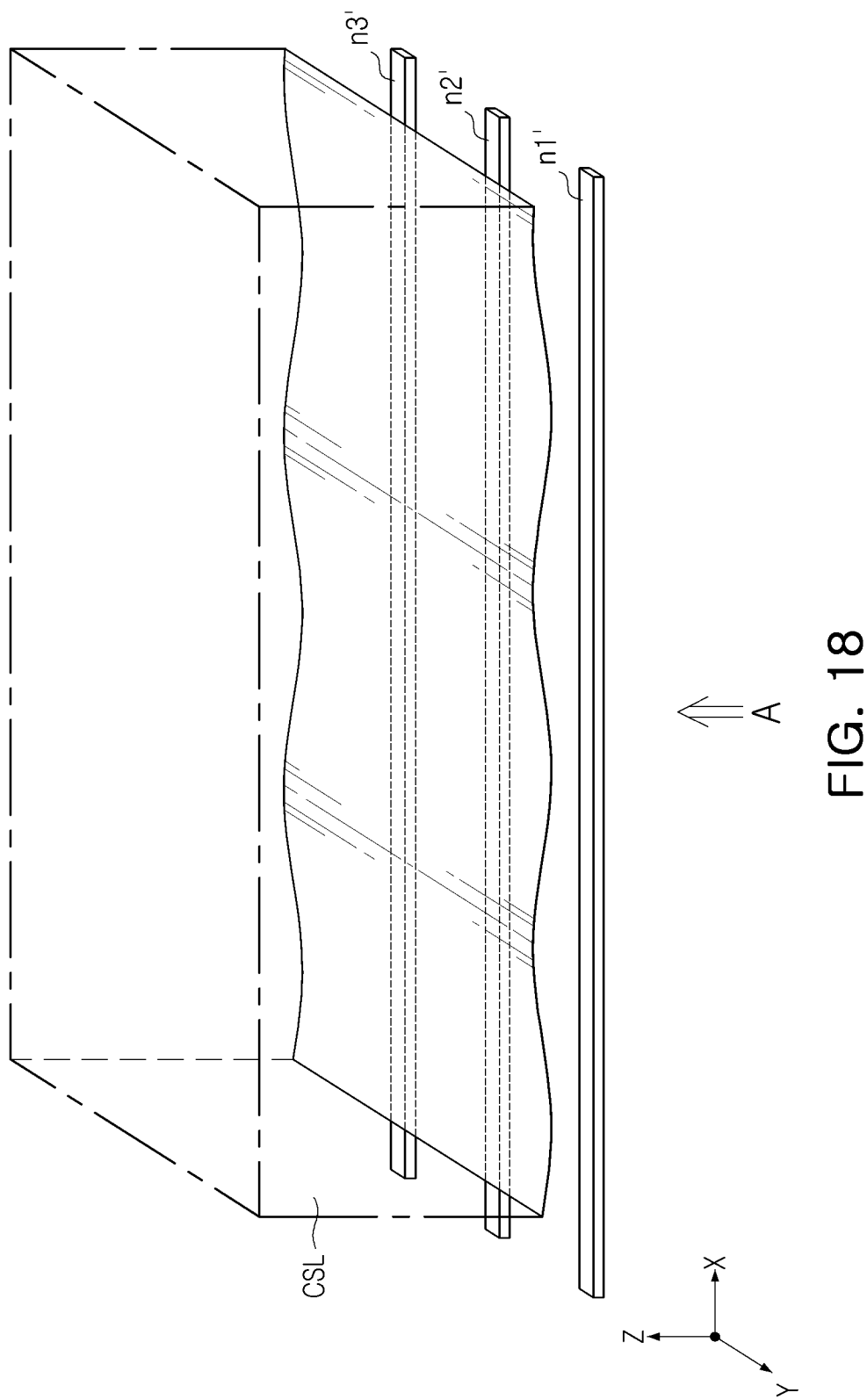
FIGS. 18 and 19 are respectively a schematic perspective view and a schematic bottom view of the memory device according to an example embodiment illustrated in FIG. 17.
Figure 19:
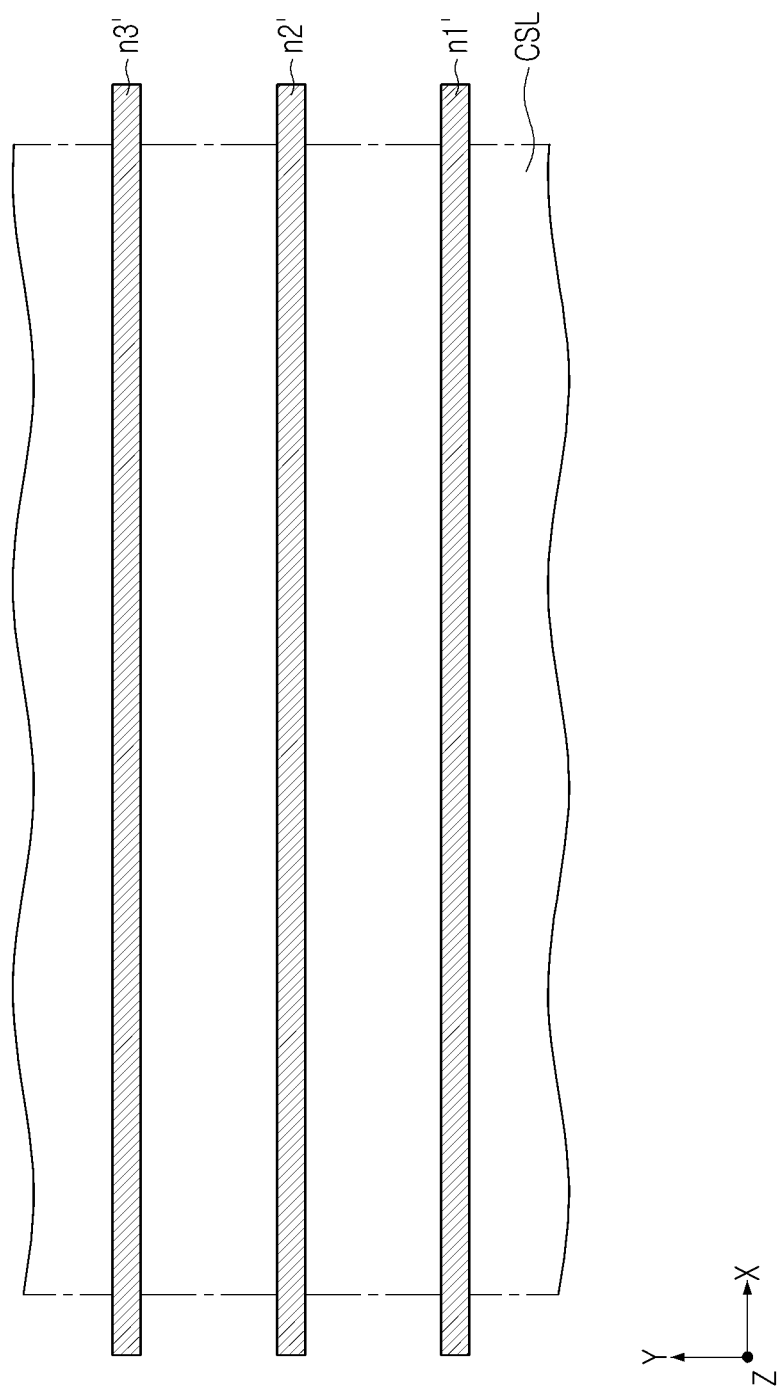

FIGS. 18 and 19 are respectively a schematic perspective view and a schematic bottom view of the memory device according to an example embodiment illustrated in FIG. 17.

FIG. 18 may be a view illustrating a common source line CSL, included in the memory device 900 according to an example embodiment illustrated in FIG. 17, and a plurality of upper metal lines n1', n2', and n3' disposed below the common source line CSL. FIG. 19 may be a bottom view of the embodiment of FIG. 18 when viewed in direction A.

Referring to FIGS. 18 and 19, a plurality of upper metal lines n1', n2', and n3' may be disposed below the common source line CSL. However, unlike the memory devices 700 and 800 according to the embodiments of FIGS. 11 and 14, the plurality of upper metal lines n1', n2', and n3' may extend in a third direction in which first regions and second regions are alternately disposed. For example, the plurality of upper metal lines n1', n2', and n3' may be disposed to cross under the first regions, the second regions, and the third regions. In this case, at least one of the plurality of upper metal lines n1', n2', and n3' may include a first metal line through which a first signal is transmitted, and the remainder of the plurality of upper metal lines n1', n2', and n3' may include a second metal line through which a second signal is transmitted. However, this is only an example and the present disclosure is not limited thereto, and the plurality of upper metal lines n1', n2', and n3' may not include the first metal line through which the first signal is transmitted. For example, the plurality of upper metal lines n1', n2', and n3' may all be second metal lines through which the second signal is transmitted.

To significantly reduce coupling noise for the first signal including a significant/sensitive signal, locations of the first metal lines, through which the first signal is transmitted, may be determined in consideration of a placement relationship of neighboring metal lines and elements. As an example, first coupling capacitance may be formed between the first metal lines and the first regions of the first semiconductor substrate 901, and second coupling capacitance may be formed between the second metal lines and the second regions of the first semiconductor substrate 901. As an example, the first coupling capacitance may be less than the second coupling capacitance. The memory device 900 according to an example embodiment may reduce the first coupling capacitance to reduce the coupling noise for the first signal. Therefore, in consideration of the placement relationship of neighboring metal lines and elements, among the plurality of upper metal lines n1', n2', and n3', a metal line able to effectively reduce the first coupling capacitance may be used as a first metal line.

Figure 20:
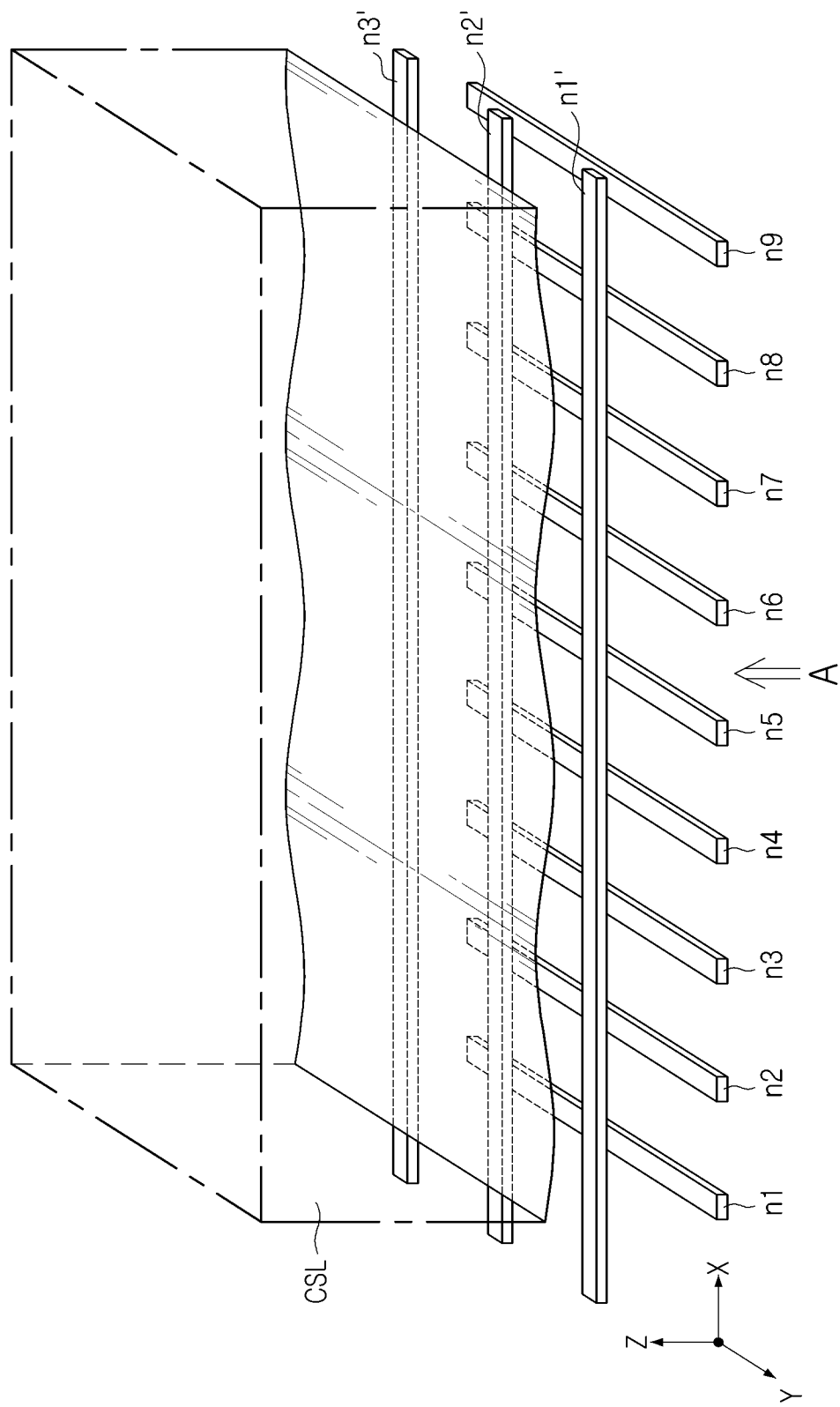
FIGS. 20 and 21 are respectively a schematic perspective view and a schematic bottom view of the memory device according to an example embodiment illustrated in FIG. 17.
Figure 21:
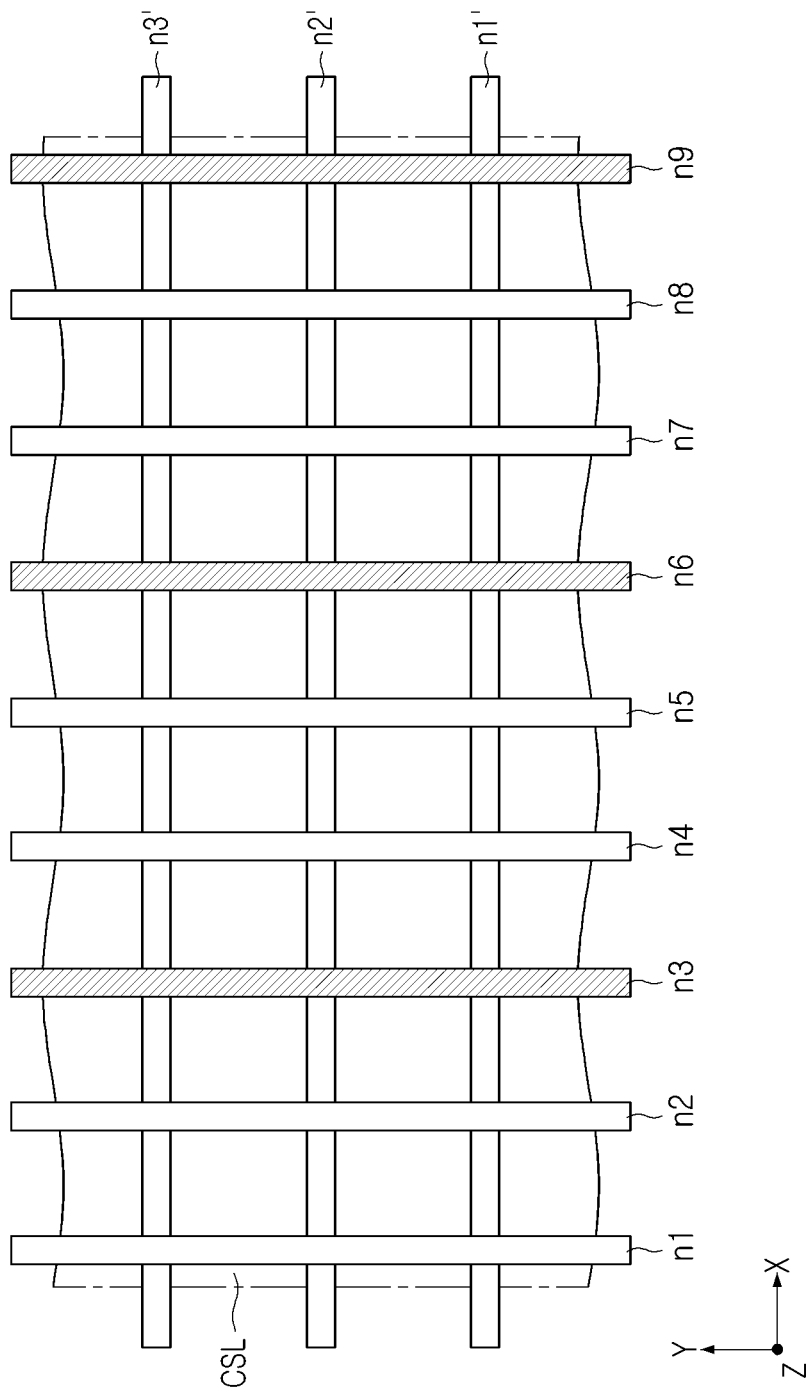

FIGS. 20 and 21 are respectively a schematic perspective view and a schematic bottom view of the memory device according to an example embodiment illustrated in FIG. 17.

FIG. 20 illustrates a common source line CSL, included in the memory device 900 according to an example embodiment illustrated in FIG. 17, and a plurality of upper metal lines n1', n2', and n3' disposed below the common source line CSL as well as a plurality of lower metal lines n1, n2, . . . , and n9 disposed below the plurality of upper metal lines n1', n2', and n3'. FIG. 21 may be a bottom view of the embodiment of FIG. 20 when viewed in direction A.

Referring to FIGS. 20 and 21, a plurality of upper metal lines n1', n2', and n3' may be disposed below the common source line CSL, and may correspond to the plurality of upper metal lines n1', n2', and n3' illustrated in FIGS. 18 and 19, respectively. However, the memory device 900 according to an example embodiment may further include a plurality of lower metal lines n1, n2, . . . , and n9 disposed at a second height lower than a first height at which a plurality of upper metal lines n1', n2', and n3' are disposed and extending in a second direction perpendicular to a direction in which the plurality of upper metal lines n1', n2', and n3' extend. As an example, to prevent an operational issue of a memory device from occurring due to coupling noise, the plurality of upper metal lines n1', n2', and n3' disposed to be close to the common source line CSL may not include a first upper metal line through which a first signal including a significant/sensitive signal is transmitted. However, this is only an example, and at least one of the plurality of upper metal lines n1', n2', and n3' may include the first upper metal line.

The plurality of lower metal lines n1, n2 . . . , and n9 may include a first lower metal line, through which a first signal is transmitted, and a second lower metal line through which a second signal is transmitted. As an example, the first lower metal line may be disposed below first regions, and the second lower metal line may be disposed below the second regions or the third regions. Accordingly, at least one of the lower metal lines n3, n6, and n9, included in a first group, may include the first lower metal line. The remainder of the lower metal lines n3, n6, and n9, included in the first group, may include a second lower metal line through which the second signal is transmitted. In addition, at least one of the lower metal lines m1, m2, m4, m5, m7, and m8, included in a second group, may include a second lower metal line through which the second signal is transmitted. However, this is only an example embodiment and the present disclosure is not limited thereto. According to example embodiments, the first metal lines may be disposed in a portion of third regions, rather than the first regions.

First coupling capacitance, formed between the common source line CSL and the first lower metal line, may be less than second coupling capacitance formed between the common source line CSL and the second lower metal line. A structure of the lower surface of the common source line CSL may not be limited to those illustrated in FIGS. 20 and 21. As an example, at least some of the first and second regions alternately disposed may have different lengths in a third direction in which the plurality of upper metal lines n1', n2', and n3' extend.

As described above, in a memory device according to an example embodiment, a distance between a common source line and a metal line facing the common source line may be adjusted based on curvature of a lower surface of the common source line. A placement of the metal line may vary depending on significance of a signal applied to the metal line. Thus, an effect of coupling capacitance on a significant/sensitive signal from the common source line may be reduced.

While example embodiments have been shown and described above, it will be apparent to those skilled in the art that modifications and variations could be made without departing from the scope of the present inventive concept as defined by the appended claims.

What is claimed is:

1. A memory device comprising:
a memory cell region including a first semiconductor substrate, gate electrodes spaced apart from each other on the first semiconductor substrate to be stacked in a first direction, perpendicular to an upper surface of the first semiconductor substrate, and channel structures penetrating through the gate electrodes and electrically connected to the first semiconductor substrate; and
a peripheral circuit region including a second semiconductor substrate disposed below the memory cell region, and a plurality of upper metal lines disposed above the second semiconductor substrate, with each of the upper metal lines has an upper surface disposed at a first height and extending in a second direction, parallel to an upper surface of the second semiconductor substrate,
wherein the first semiconductor substrate includes first regions having a first distance between a lower surface of the first semiconductor substrate and an upper surface of first upper metal lines of the plurality of upper metal lines, and second regions having a second distance between the lower surface of the first semiconductor substrate and an upper surface of second upper metal lines of the plurality of upper metal lines, the second distance is shorter than the first distance, and
wherein the first upper metal lines are disposed below the first regions, and the second upper metal lines are disposed below the second regions, and at least one of the first upper metal lines is configured to transmit a reference voltage for operating the memory cell region and the peripheral circuit region.

2. The memory device of claim 1, wherein the reference voltage includes a bandgap reference (BGR) signal.

3. The memory device of claim 1, wherein the first height includes a height of an upper surface of an uppermost layer, among layers on which metal lines are disposed.

4. The memory device of claim 1, wherein the first regions and the second regions are laterally arranged in the first semiconductor substrate, and are alternately disposed in a third direction perpendicular to the second direction.

5. The memory device of claim 4, wherein a distance between a pair of first regions adjacent to each other in the third direction, among the first regions, is the same as a distance between a pair of upper metal lines adjacent to each other in the third direction, among the plurality of upper metal lines.

6. The memory device of claim 4, wherein at least two of the plurality of upper metal lines are disposed below a portion between a pair of first regions adjacent to each other in the third direction, among the first regions.

7. The memory device of claim 4, wherein a pair of first regions adjacent to each other, among the first regions, and a pair of second regions adjacent to each other, among the second regions, each have the same length in the third direction.

8. The memory device of claim 4, wherein at least some of the first regions and the second regions have different lengths in the third direction.

9. The memory device of claim 8, wherein at least one of a pair of first regions adjacent to each other, among the first regions, and a pair of second regions adjacent to each other, among the second regions, have different lengths in the third direction.

10. The memory device of claim 8, wherein at least one of the first regions is adjacent to a second region having the same length on a first side in the third direction, and is adjacent to a second region having a different length on a second side in the third direction.

11. The memory device of claim 1, wherein the number of the first regions is the same as the number of the second regions.

12. The memory device of claim 1, wherein
a sum of lengths of the first regions is the same as a sum of lengths of the second regions, in a third direction parallel to the first semiconductor substrate and the second semiconductor substrate and perpendicular to the second direction.

13. The memory device of claim 1, wherein the first semiconductor substrate further includes third regions having a third distance between a lower surface of the first semiconductor substrate and an upper surface of third upper metal lines of the plurality of upper metal lines, the third distance being between the first distance and the second distance, and
the first semiconductor substrate has an inclined lower surface in the third regions.

14. The memory device of claim 1, wherein the first semiconductor substrate further includes third regions having a third distance between a lower surface of the first semiconductor substrate and an upper surface of third upper metal lines of the plurality of upper metal lines, the third distance being between the first distance and the second distance, and
the first semiconductor substrate has a lower surface having curvature in the third regions.

15. The memory device of claim 1, wherein a length of the first regions in a third direction, parallel to the first semiconductor substrate and the second semiconductor substrate and perpendicular to the second direction, is determined based on the first distance and the second distance.

16. A memory device comprising:
a memory cell region including a first semiconductor substrate, gate electrodes spaced apart from each other on the first semiconductor substrate to be stacked in a first direction, perpendicular to an upper surface of the first semiconductor substrate, and channel structures penetrating through the gate electrodes and disposed in a recessed portion of the first semiconductor substrate; and
a peripheral circuit region including a second semiconductor substrate disposed below the memory cell region, a plurality of lower metal lines disposed above the second semiconductor substrate at a predetermined height to extend in a second direction, parallel to an upper surface of the second semiconductor substrate, and a plurality of upper metal lines disposed between the plurality of lower metal lines and the first semiconductor substrate to extend in a third direction, parallel to an upper surface of the second semiconductor substrate and perpendicular to the second direction,
wherein the first semiconductor substrate includes first regions, having a first distance between a lower surface of the first semiconductor substrate and an upper surface of first upper metal lines of the plurality of upper metal lines, and second regions having a second distance between a lower surface of the first semiconductor substrate and an upper surface of second upper metal lines of the plurality of upper metal lines, the second distance being shorter than the first distance, wherein the first upper metal lines and second upper metal lines are at the same height with respect to a top surface of the second semiconductor substrate, and wherein the first regions and the second regions are alternately disposed in the third direction.

17. The memory device of claim 16, wherein the first upper metal lines are configured to transmit a first signal, and the second upper metal lines are configured to transmit a second signal different from the first signal, and the first signal includes a reference signal for operating the memory cell region and the peripheral circuit region.

18. The memory device of claim 16, wherein the plurality of lower metal lines include first lower metal lines configured to transmit a first signal, and second lower metal lines configured to transmit a second signal different from the first signal, and the first lower metal lines are disposed below the first regions, and the first signal includes a reference voltage for operating the memory cell region and the peripheral circuit region.

19. The memory device of claim 16, wherein among the first regions and the second regions alternately disposed, at least some regions have different lengths in a direction in which the plurality of upper metal lines extend.

20. A memory device comprising:

a first semiconductor substrate including first regions, having a first thickness, and second regions having a second thickness greater than the first thickness;

a second semiconductor substrate disposed below the first semiconductor substrate to overlap the first semiconductor substrate in a first direction, perpendicular to an upper surface of the first semiconductor substrate;

a plurality of metal lines disposed between the first semiconductor substrate and the second semiconductor substrate to extend in a direction, parallel to an upper surface of the second semiconductor substrate, and including first metal lines configured such that a bandgap reference signal is transmitted through the first metal lines;

gate electrodes spaced apart from each other on the first semiconductor substrate to be stacked in the first direction;

insulating layers stacked alternately with the gate electrodes; and channel structures penetrating through the gate electrodes and the insulating layers and disposed in a recessed portion of the first semiconductor substrate, wherein the first metal lines are disposed below the first regions.

* * * * *